United States Patent [19]

Manabe et al.

[11] Patent Number: 5,955,738
[45] Date of Patent: *Sep. 21, 1999

[54] EXPOSURE DATA PREPARING APPARATUS, EXPOSURE DATA PREPARING METHOD AND CHARGED PARTICLE BEAM EXPOSURE APPARATUS

[75] Inventors: Yasuo Manabe; Hiromi Hoshino, both of Kawasaki, Japan

[73] Assignee: Fujitsu Limited, Kawasaki, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/616,517

[22] Filed: Mar. 19, 1996

[30] Foreign Application Priority Data

Mar. 20, 1995 [JP] Japan ................................. 7-061279
Jan. 29, 1996 [JP] Japan ................................. 8-013354

[51] Int. Cl.$^6$ .................................................. H01J 37/302
[52] U.S. Cl. ................................................... 250/492.22
[58] Field of Search ........................................ 250/492.22

[56] References Cited

U.S. PATENT DOCUMENTS

| 4,500,789 | 2/1985 | Ban et al. | 250/492.22 |
| 5,149,975 | 9/1992 | Yoda et al. | 250/492.22 |
| 5,278,419 | 1/1994 | Takahashi et al. | 250/492.22 |

*Primary Examiner*—Jack I. Berman

[57] ABSTRACT

An exposure data preparing apparatus includes a field placement editor for placing exposure patterns that correspond to design data. Placement is done for each sub-field obtained by dividing a field on an LSI to be designed, and each sub-field has a size that can be covered by deflection of a beam from an exposure apparatus. A map preparing editor prepares a plurality of maps that can be covered by a single shot of the charged particle beam, by dividing the sub-field in which the exposure pattern is placed. A CPU determines a beam dosage of the charged particle beam derived from a density of the exposure pattern in the map.

22 Claims, 42 Drawing Sheets

A : AREA CONSISTING OF 25 (5×5) MAPS

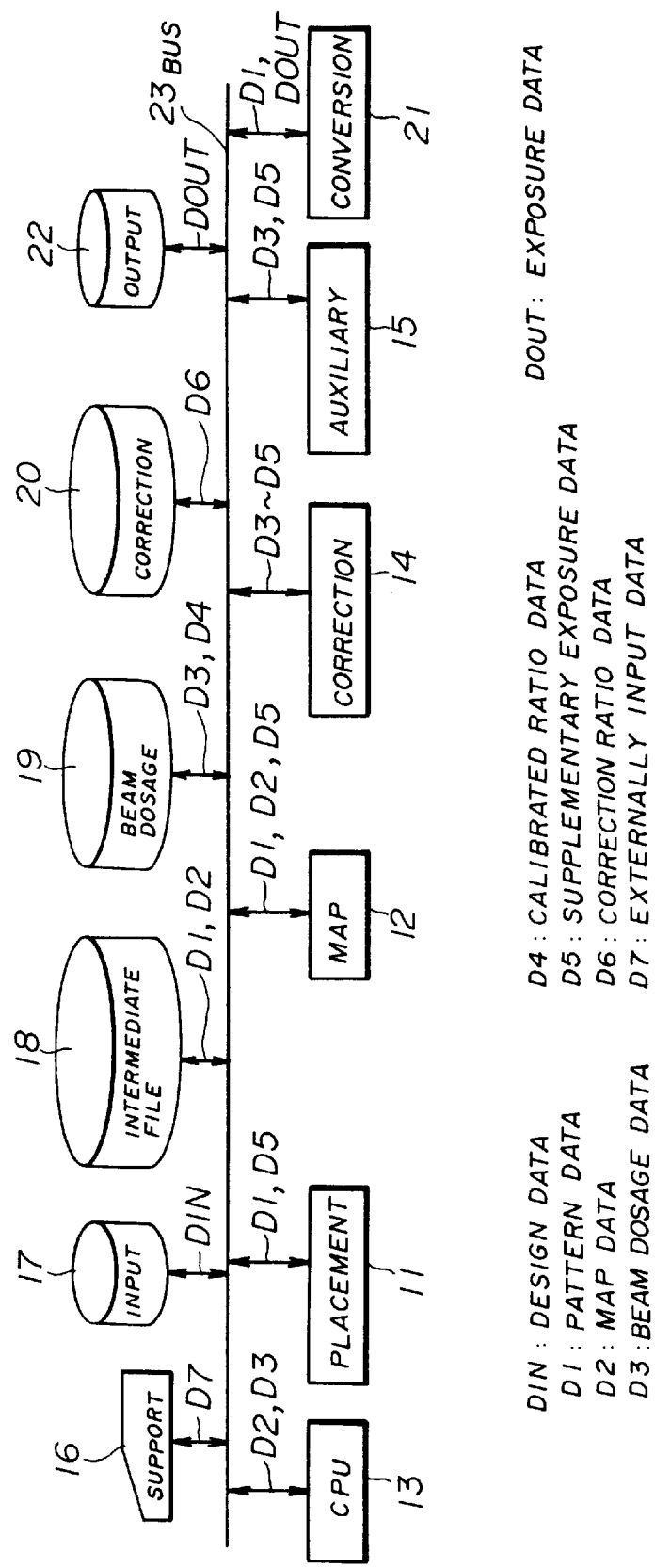

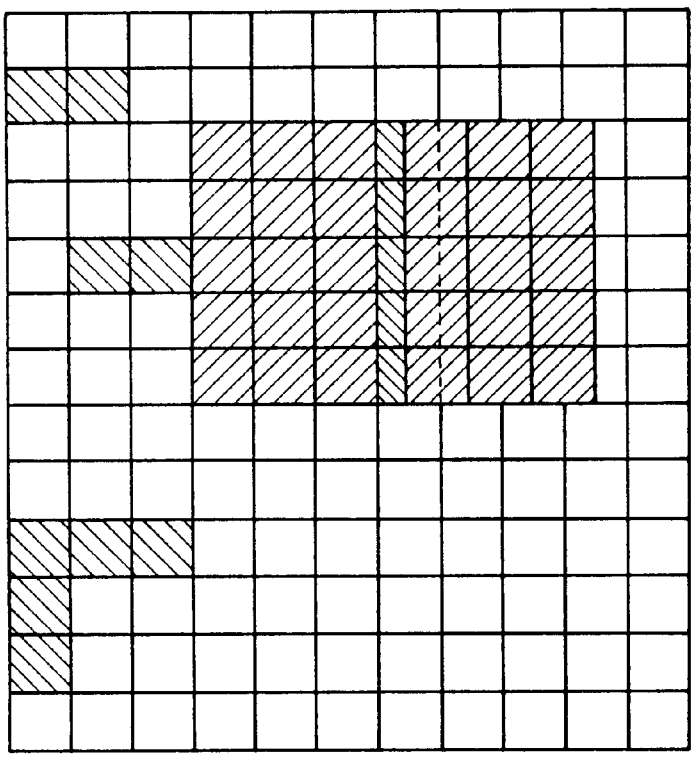

FIG. 4
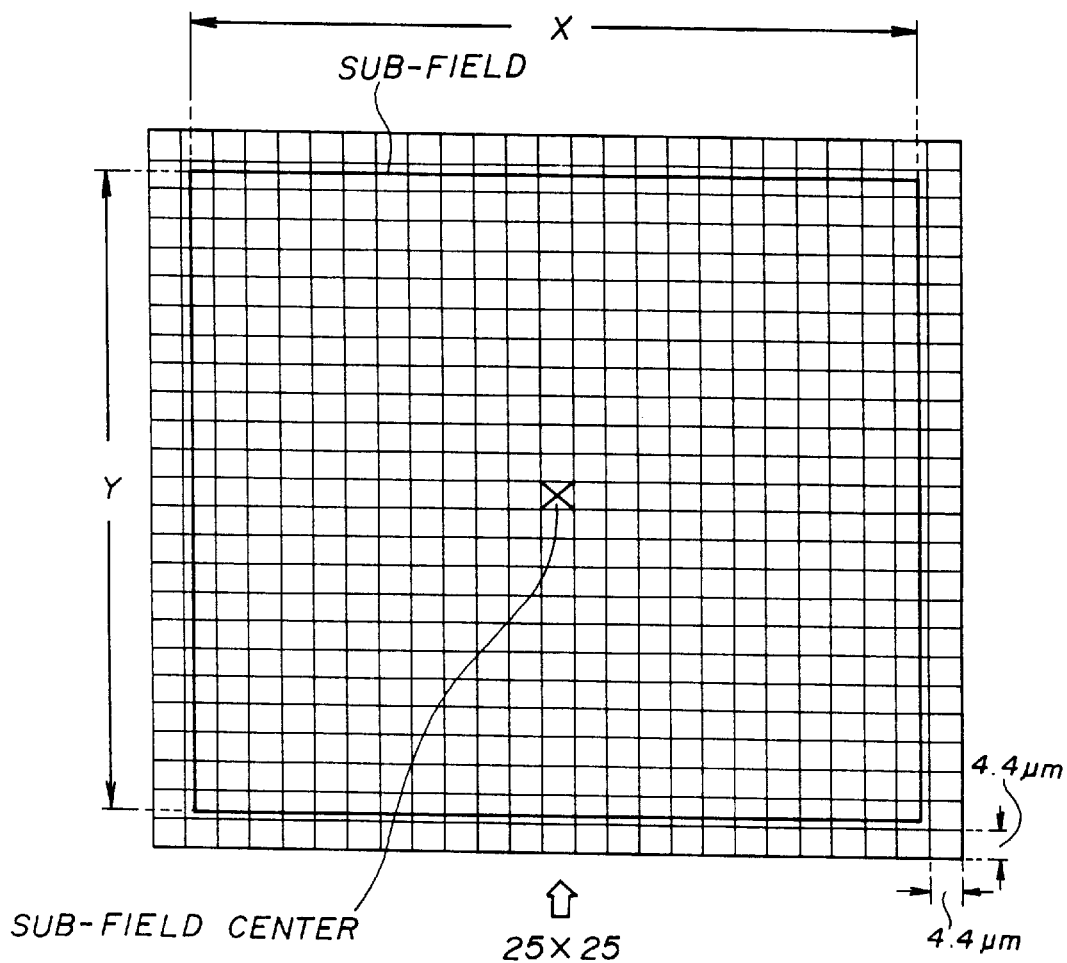
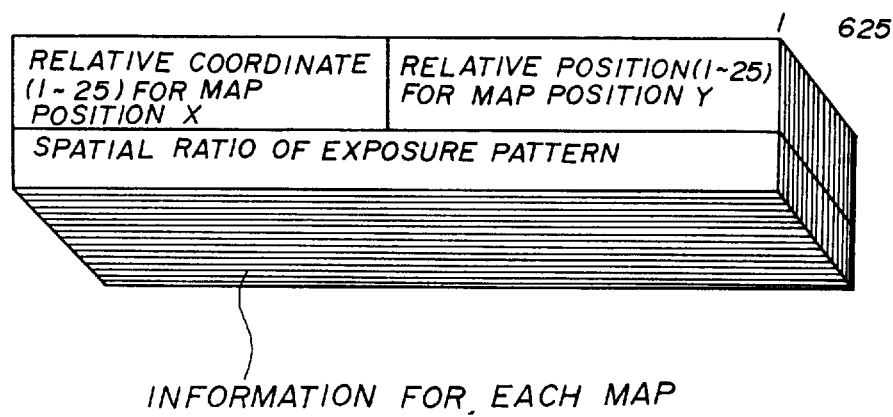

SUB-FIELD

A: AREA CONSISTING OF 25 (5×5) MAPS

SAMPLE EXPOSURE COMPUTATION ACCORDING TO EXPOSURE PATTERN p1

$map6 = ((x2-x1) \times (y2-y1)) / \text{AREA OF MAP}$
$map7 = ((x3-x2) \times (y2-y1)) / \text{AREA OF MAP}$
$map8 = ((x4-x3) \times (y2-y1)) / \text{AREA OF MAP}$
$map11 = ((x2-x1) \times (y3-y2)) / \text{AREA OF MAP}$
$map12 = ((x3-x2) \times (y3-y2)) / \text{AREA OF MAP}$
$map13 = ((x4-x3) \times (y3-y2)) / \text{AREA OF MAP}$

FIG. 7

| STAGE | STAGES OF PATTERN DENSITY (%) | REQUIREMENT FOR SUPPLEMENTARY EXPOSURE PATTERN DATA | CORRECTION RATIO α APPLIED WHEN BEAM DOSAGE IS REVISED OR WHEN SUPPLEMENTARY EXPOSURE DATA IS REQUIRED |
|---|---|---|---|
| 1 | 0.0 ~ 9.5 | SUPPLEMENTARY EXPOSURE 1 | 1.0 |
| 2 | 9.5 ~ 18.5 | SUPPLEMENTARY EXPOSURE 2 | 1.0 |
| 3 | 18.5 ~ 27.5 | SUPPLEMENTARY EXPOSURE 3 | 1.0 |
| 4 | 27.5 ~ 36.5 | SUPPLEMENTARY EXPOSURE 4 | 1.0 |
| 5 | 36.5 ~ 45.5 | SUPPLEMENTARY EXPOSURE 5 | 1.0 |
| 6 | 45.5 ~ 54.5 | NO SUPPLEMENTARY EXPOSURE | 1.0 |
| 7 | 54.5 ~ 63.5 | NO SUPPLEMENTARY EXPOSURE | 0.8 |
| 8 | 63.5 ~ 72.5 | NO SUPPLEMENTARY EXPOSURE | 0.6 |
| 9 | 72.5 ~ 81.5 | NO SUPPLEMENTARY EXPOSURE | 0.4 |
| 10 | 81.5 ~ 90.5 | NO SUPPLEMENTARY EXPOSURE | 0.2 |
| 11 | 90.5 ~ 100.0 | NO SUPPLEMENTARY EXPOSURE | 0.1 |

▨ REVISION TARGET MAP

☐ MAPS AFFECTED BY REVISION TARGET MAP

FIG.9A

| EXPOSURE DISTANCE STAGE | (1) | (2) | (3) | (4) | (5) | (6) | (7) | (8) | (9) | (10) |
|---|---|---|---|---|---|---|---|---|---|---|
| DISTANCE TO TARGET MAP | 1.00 | 1.14 | 2.00 | 2.20 | 3.00 | 3.42 | 4.00 | 4.56 | 5.00 | 5.71 |
| CALIBRATION RATIO FOR BEAM DOSAGE | 0.90 | 0.79 | 0.80 | 0.70 | 0.60 | 0.53 | 0.40 | 0.35 | 0.20 | 0.17 |

FIG.9B

| EXPOSURE DISTANCE STAGE | (1) | (2) | (3) | (4) |
|---|---|---|---|---|
| DISTANCE TO TARGET MAP | 1.00 | 1.14 | 2.00 | 2.28 |
| CALIBRATION RATIO B OF EXPOSURE LEVEL | 0.20 | 0.17 | 0.18 | 0.15 |

FIG. 13

| 19 | | | | | | | | | | | | | | | |
|---|---|---|---|---|---|---|---|---|---|---|---|---|---|---|---|
| FIELD NO. | SUB FIELD CENTER X-COORDINATE | SUB FIELD CENTER Y-COORDINATE | POSITION x IN MAP IN SUB-FIELD | BEAM DOSAGE IN % | POSITION x IN MAP IN SUB-FIELD | BEAM DOSAGE IN % | POSITION x IN MAP IN SUB-FIELD | BEAM DOSAGE IN % | POSITION x IN MAP IN SUB-FIELD | POSITION x IN MAP IN SUB-FIELD | BEAM DOSAGE IN % | POSITION x IN MAP IN SUB-FIELD | BEAM DOSAGE IN % | POSITION x IN MAP IN SUB-FIELD | BEAM DOSAGE IN % |

BLOCK PATTERN

BLOCK EXPOSURE AREA

BLOCK PATTERN

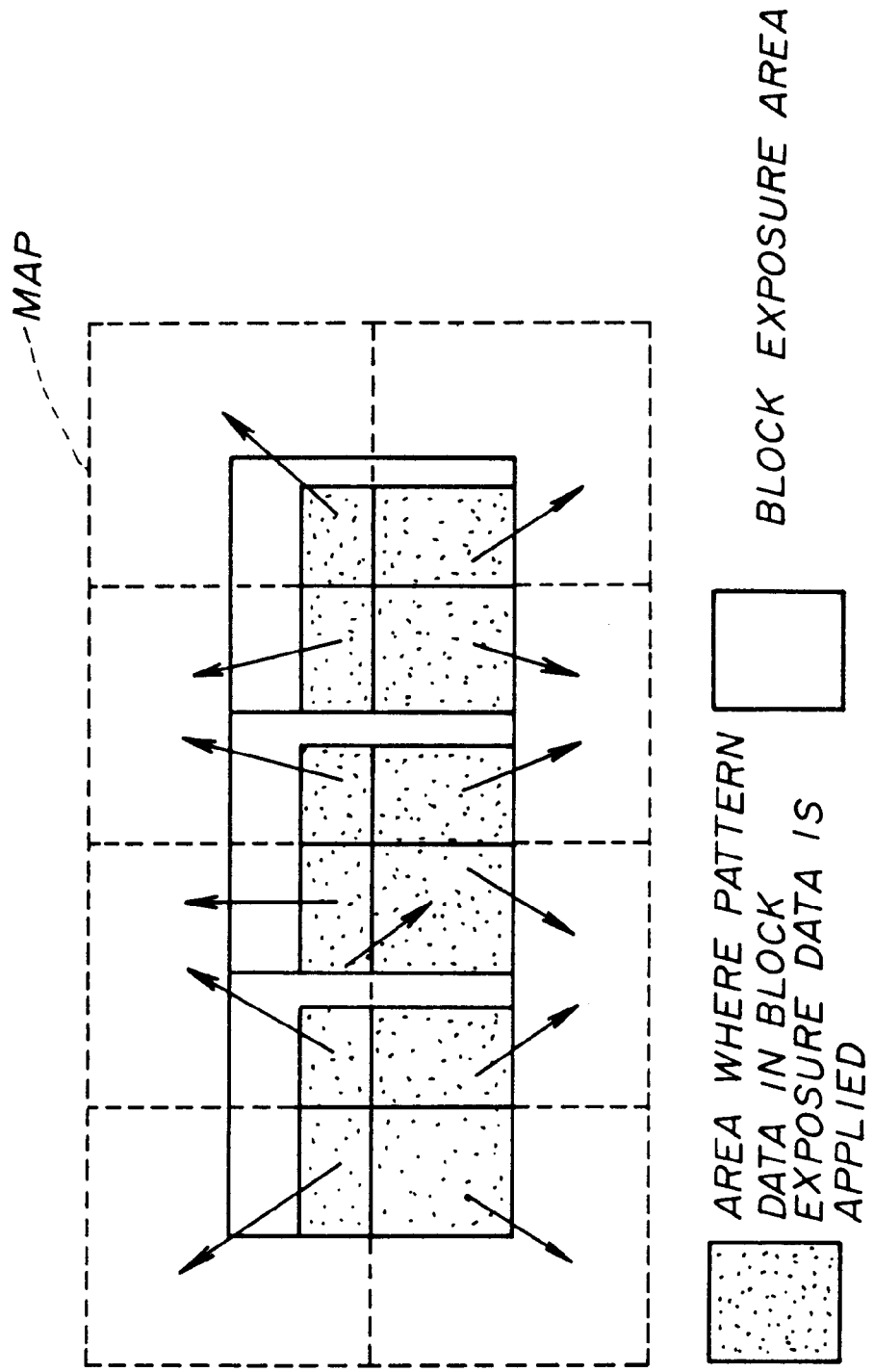

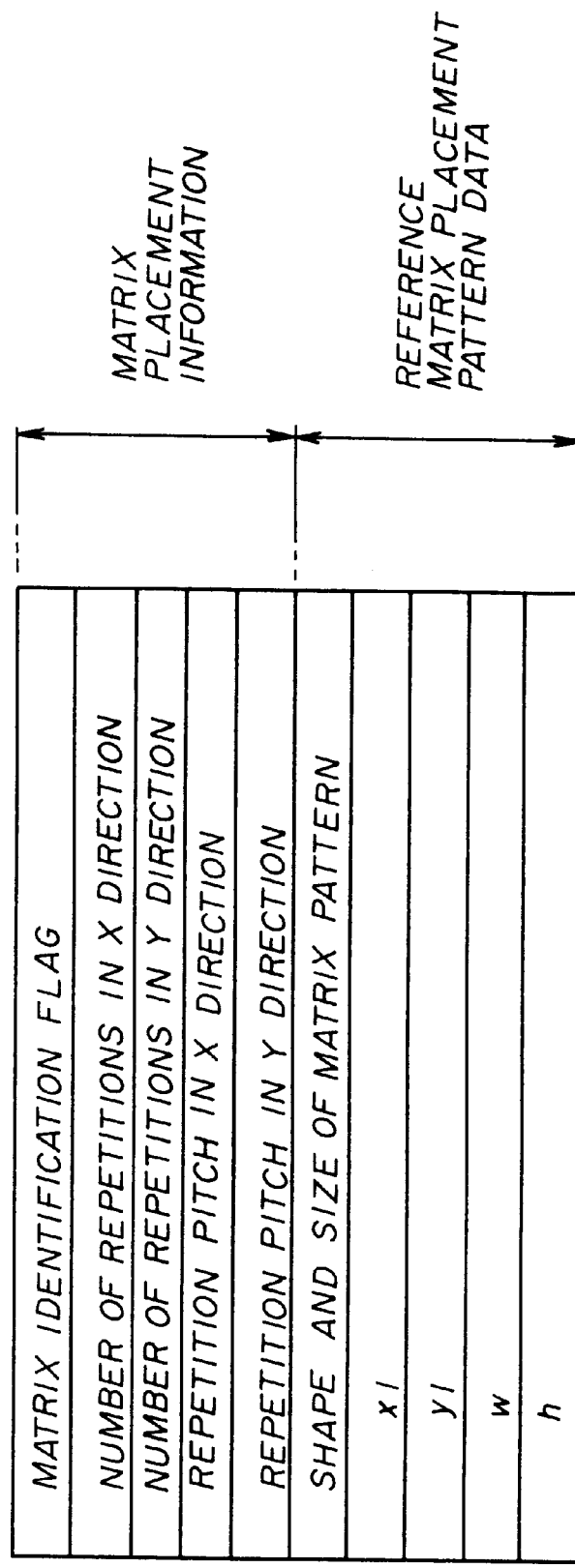

REFERENCE MATRIX PLACEMENT SUB-FIELD

MATRIX PLACEMENT SUB-FIELD (SAME AS REFERENCE MATRIX PLACEMENT SUB-FIELD)

SINGULAR PLACEMENT SUB-FIELD

TEMPORARY SINGULAR PLACEMENT SUB-FIELD

Pa : EXPOSURE PATTERN

FIG. 24

SUB-FIELD MAP

| 1.7% | 0% | 0% | 0% | 0% | 0% | 14.0% | 8% | 16.0% | 18.0% | 17.0% |
|---|---|---|---|---|---|---|---|---|---|---|
| 0% | 3.5% | 4.0% | 0% | 0% | 0% | 28.0% | 24.0% | 32.0% | 31.5% | 20.0% |
| 0% | 4.0% | 5.3% | 0% | 0% | 0% | 42.0% | 30.0% | 42.4% | 36.0% | 20.0% |
| 0% | 0% | 0% | 0% | 0% | 0% | 56.0% | 42.0% | 48.0% | 36.0% | 20.0% |
| 0% | 0% | 0% | 0% | 0% | 0% | 55.3% | 40.0% | 48.0% | 36.0% | 18.0% |
| 0% | 0% | 0% | 0% | 36.0% | 40% pa | 63.0% | 48.0% | 48.0% | 32.0% | 16.0% |
| 8.0% | 16.0% | 24.0% | 32.0% | 31.6% | 36.0% | 55.3% | 40.0% | 36.0% | 20.0% | 12.0% |
| 8.0% | 28.0% | 42.0% | 49.0% | 56.0% | 32.0% | 56.0% | 49.0% | 42.0% | 28.0% | 14.0% |
| 8.0% | 28.0% | 37.1% | 42.0% | 42.0% | 24.0% | 18.0% | 18.0% | 15.9% | 12.0% | 6.0% |
| 8.0% | 14.0% | 16.0% | 16.0% | 16.0% | 16.0% | 12.0% | 12.0% | 12.0% | 10.5% | 6.0% |
| 0% | 0% | 0% | 0% | 0% | 4.0% | 4.0% | 4.0% | 4.0% | 4.0% | 3.4% |

P1~P13 : MATRIX PLACEMENT PATTERN

FIG. 26

| Reference matrix placement sub-field | Number of repetitions | | Repetition pitch | | Pattern data that forms matrix |
|---|---|---|---|---|---|
| | X | Y | X | Y | |
| P1 | 4 | 2 | px1 | Starting point y coordinate of P13 - Starting point y coordinate of P1 | p2, p3, p4, p13, p14, p15, p16 |
| P5 | 2 | 2 | Starting point x coordinate of P8 - Starting point x coordinate of P5 | Starting point y coordinate of P9 - Starting point y coordinate of P5 | p8, p9, p12 |
| P6 | 2 | 2 | Starting point x coordinate of P7 - Starting point x coordinate of P6 | Starting point y coordinate of P10 - Starting point y coordinate of P6 | p7, p10, p11 |

FIG.27

| STAGE | STAGES OF PATTERN DENSITY (%) | REQUIREMENT FOR SUPPLEMENTARY EXPOSURE PATTERN DATA | CORRECTION RATIO α APPLIED WHEN BEAM DOSAGE IS REVISED OR WHEN SUPPLEMENTARY EXPOSURE DATA IS REQUIRED |
|---|---|---|---|
| 1 | 0.0~7.5 | SUPPLEMENTARY EXPOSURE 3 | 1.0 |
| 2 | 7.5~16.5 | SUPPLEMENTARY EXPOSURE 4 | 1.0 |
| 3 | 16.5~25.5 | SUPPLEMENTARY EXPOSURE 5 | 1.0 |
| 4 | 25.5~34.5 | NO SUPPLEMENTARY EXPOSURE | 0.8 |
| 5 | 34.5~43.5 | NO SUPPLEMENTARY EXPOSURE | 0.6 |
| 6 | 43.5~52.5 | NO SUPPLEMENTARY EXPOSURE | 0.4 |
| 7 | 52.5~61.5 | NO SUPPLEMENTARY EXPOSURE | 0.2 |
| 8 | 61.5~70.5 | NO SUPPLEMENTARY EXPOSURE | 0.1 |
| 9 | 70.5~79.5 | NO SUPPLEMENTARY EXPOSURE | 0.1 |
| 10 | 79.5~88.5 | NO SUPPLEMENTARY EXPOSURE | 0.1 |
| 11 | 88.5~100 | NO SUPPLEMENTARY EXPOSURE | 0.1 |

MAP

EXPOSURE PATTERN

MAP ADMITTING AREA (REMOVED BY A MAXIMUM DISTANCE OF 5μm)

PA : EXPOSURE PATTERN

EXPOSURE DATA PREPARING APPARATUS, EXPOSURE DATA PREPARING METHOD AND CHARGED PARTICLE BEAM EXPOSURE APPARATUS

BACKGROUND OF THE INVENTION

1. Field of the Invention

The present invention relates to exposure data preparing apparatuses, exposure data preparing methods and charged particle beam exposure apparatuses, and more particularly to an apparatus and a method for preparing exposure data that is used in exposing a pattern on a semiconductor wafer, and an exposure apparatus in which the method is applied.

2. Description of the Prior Art

Generally, an electron beam exposure apparatus is used to produce a mask for a semiconductor integrated circuit (LSI). The electron beam exposure apparatus exposes a predetermined pattern on an exposed area on a semiconductor wafer. The exposed area on the wafer is divided into areas, each area called a field and having a predetermined size. The field is further divided into smaller areas called sub-fields, each sub-field having a predetermined size.

LSI design data is provided for each sub-field. Singular placement pattern data places an exposure pattern on a sub-field by itself. Matrix placement pattern data places a plurality of exposure patterns on associated sub-fields using the same data. Each set of data contains information relating to placement of an exposure pattern, the number of patterns placed, the identification number for placement, and a range of placement. There are four types of pattern data: singular placement pattern data; singular block exposure pattern data capable of exposing a plurality of patterns with one beam shot; matrix placement block exposure pattern data including information relating to position of placement; and matrix placement pattern including information relating to position of placement.

A description will now be given of how exposure data is prepared according to the prior art. Data preparation method according to Japanese Laid-Open Patent Application No. 5-74691 that the applicant has filed will be discussed. As shown in FIG. 1A, a field which is to be exposed is divided into a total of 49 (7×7) sub-fields. A matrix placement pattern 1 that derives from LSI design data is placed on the sub-fields. According to this placement, the matrix placement pattern data is registered in each of the 49 sub-fields.

The matrix placement pattern 1 comprises a matrix placement pattern A for 9 (3×3) sub-fields for a memory pattern or the like; four matrix placement sub-patterns B through E surrounding the matrix placement sub-pattern A; and singular placement sub-fields 2 disposed at the periphery of the matrix and surrounding the matrix placement sub-patterns B through E. The matrix placement pattern 1 is surrounded by 24 singular placement sub-fields.

A dosage of beam applied (beam dosage) is determined for each pattern and for each sub-field. For correction of a beam dosage, matrix identification process of the placement pattern 1 is conducted. In this identification process, the placement pattern 1 is segmented into the singular placement sub-fields disposed at the periphery of the matrix, and the sub-fields (the matrix placement sub-patterns B through E) inside the matrix. The sub-fields at the periphery of the matrix are expanded.

As a result of this expansion, the density of the exposure pattern occupying a given sub-field is determined so that a proximity effect is corrected. The proximity effect occurs between a boundary of the exposure pattern to be corrected and an adjacent exposure pattern. The proximity effect is denoted as $\epsilon$ [$\mu$m]. In the conventional technology, correction of the proximity effect is conducted for each sub-field such that a beam projection dosage and a dimension of area to which the beam is projected are corrected. Thereafter, the corrected pattern data is converted into a format compatible with exposure data for an electron beam exposure apparatus. Thus, exposure data based on design data is prepared.

However, the conventional method of preparing exposure data has the following problem.

(1) In the matrix identification carried out in order to correct a beam dosage for each pattern, the matrix placement pattern 1 is segmented into the singular placement sub-fields at the periphery of the matrix, and the sub-fields inside the matrix, as shown in FIG. 1A. Further, the sub-fields at the periphery of the matrix are expanded. According to this approach, matrix placement patterns 2 and 3 as shown in FIGS. 1B and 1C, respectively, are recognized as individual singular placement sub-fields. In the matrix placement pattern 2, five rows of five aligned sub-fields are arranged, the two adjacent rows being spaced apart by one row. In the matrix placement pattern 3, five rows of five aligned sub-fields are arranged, the two adjacent rows being horizontally displaced from each other by one sub-field.

When sub-fields are processed as singular placement sub-fields, it is necessary to determine the pattern density for correction of the proximity effect that occurs in relationship to the surrounding sub-fields. If a large number of sub-fields are to be processed, a large volume of data is to be processed accordingly. Thus, a high-speed correction of pattern data is prevented.

(2) Memory devices that are currently produced require LSI design data that contains a large volume of matrix placement pattern data. Further, placement of exposure patterns has become increasingly complex. Therefore, a long time is required in order to recognize a matrix.

(3) According to the conventional technology, a beam dosage is determined for individual sub-fields. It is necessary to obtain a beam dosage for the exposure patterns applied to the entirety of a chip if the design data contains matrix placement pattern data or block exposure pattern data so that it is necessary to determine whether or not to prepare a supplementary exposure pattern for correction of proximity effect. The determination as to whether or not a supplementary exposure pattern is to be prepared requires a long time according to the conventional technology.

As the capacity of an LSI increases and its function is enhanced, the time required to process data by a computer increases greatly, thereby making it difficult to carry out correction of pattern data for a large-scale memory or logic device.

SUMMARY OF THE INVENTION

Accordingly, it is an object of the present invention to provide an exposure data preparing apparatus, an exposure data preparing method and a charged particle beam exposure apparatus, in which the aforementioned problems are eliminated.

Another and more specific object of the present invention is to provide an exposure data preparing method and a charged particle beam exposure apparatus, in which it is possible to prepare exposure data providing an optimum dosage of charged particle beam whatever exposure pattern is applied to sub-fields.

In order to achieve the aforementioned objects, the present invention provides an exposure data preparing apparatus for preparing exposure data for a charged beam exposure apparatus based on design data for an exposed object, the exposure data preparing apparatus comprising:

placement means for placing an exposure pattern corresponding to the design data for first fields obtained by diving an exposed field on the exposed object, each of the first fields being covered by deflection of a charged particle beam emitted by the charged beam exposure apparatus;

field preparing means for preparing second fields, each of the second fields being covered by a single shot of the charged particle beam; and calculating means for calculating a beam dosage of the charged particle beam which dosage corresponds to a density of the exposure pattern that occupies the second fields.

The aforementioned objects can also be achieved by an exposure data preparing method for preparing exposure data for a charged particle beam exposure apparatus based on design data for an exposed object, the exposure data preparing method comprising the steps of:

preparing first fields covered by deflection of a charged particle beam deflected by a deflector system of the charged particle beam exposure apparatus, by dividing an exposed field of the exposed object;

placing an exposure pattern corresponding to the design data for each of the first fields in the exposed object;

preparing second fields by dividing each of the first fields, each of the second fields being covered by a single shot of the charged particle beam;

obtaining, for each of the second fields, a density of the exposure pattern that occupies the second fields; and determining a beam dosage of the charged particle beam which dosage corresponds to the density of the exposure pattern.

The aforementioned objects can also be achieved by a charged particle beam exposure apparatus comprising:

data preparing means for preparing exposure data based on design data for an exposed object;

a control unit for supplying control signals for a beam deflector system in accordance with output data from the data preparing means;

deflecting means for deflecting the charged particle beam in accordance with output signals from the control unit; wherein the data preparing means is embodied by the exposure data preparing apparatus as claimed in claim 1.

BRIEF DESCRIPTION OF THE DRAWINGS

Other objects and further features of the present invention will be apparent from the following detailed description when read in conjunction with the accompanying drawings, in which:

FIG. 2 shows an exposure data preparing apparatus according to the embodiments of the present invention;

FIG. 3B shows how the pattern placement editor places different sub-fields;

FIG. 4 shows how a map preparing editor according to the embodiments segments a sub-field into areas;

FIG. 7 shows a content of a correction table memory and illustrates a function of a CPU according to the first embodiment;

FIG. 9A shows a calibration-ratio for a 1 $\mu$m×1 $\mu$m map according to the first embodiment;

FIG. 9B shows a calibration ratio for a 4 $\mu$m×4 $\mu$m map according to the first embodiment;

FIG. 13 shows a content of a beam dosage intermediate file according to the embodiments of the present invention;

FIGS. 17A, 17B and 17C explain a block exposure pattern according to the embodiments of the present invention;

FIGS. 19A, 19B and 19C explain a matrix placement pattern on maps according to the embodiments of the present invention;

FIG. 24 explains a beam dosage revision process according to the first embodiment of the present invention;

FIG. 26 explains a process of rearranging matrix placement patterns according to the embodiments of the present invention;

FIG. 27 shows a content of a correction table memory and illustrates a function of a CPU according to a second embodiment of the present invention;

DESCRIPTION OF THE PREFERRED EMBODIMENTS

Figure 1A:
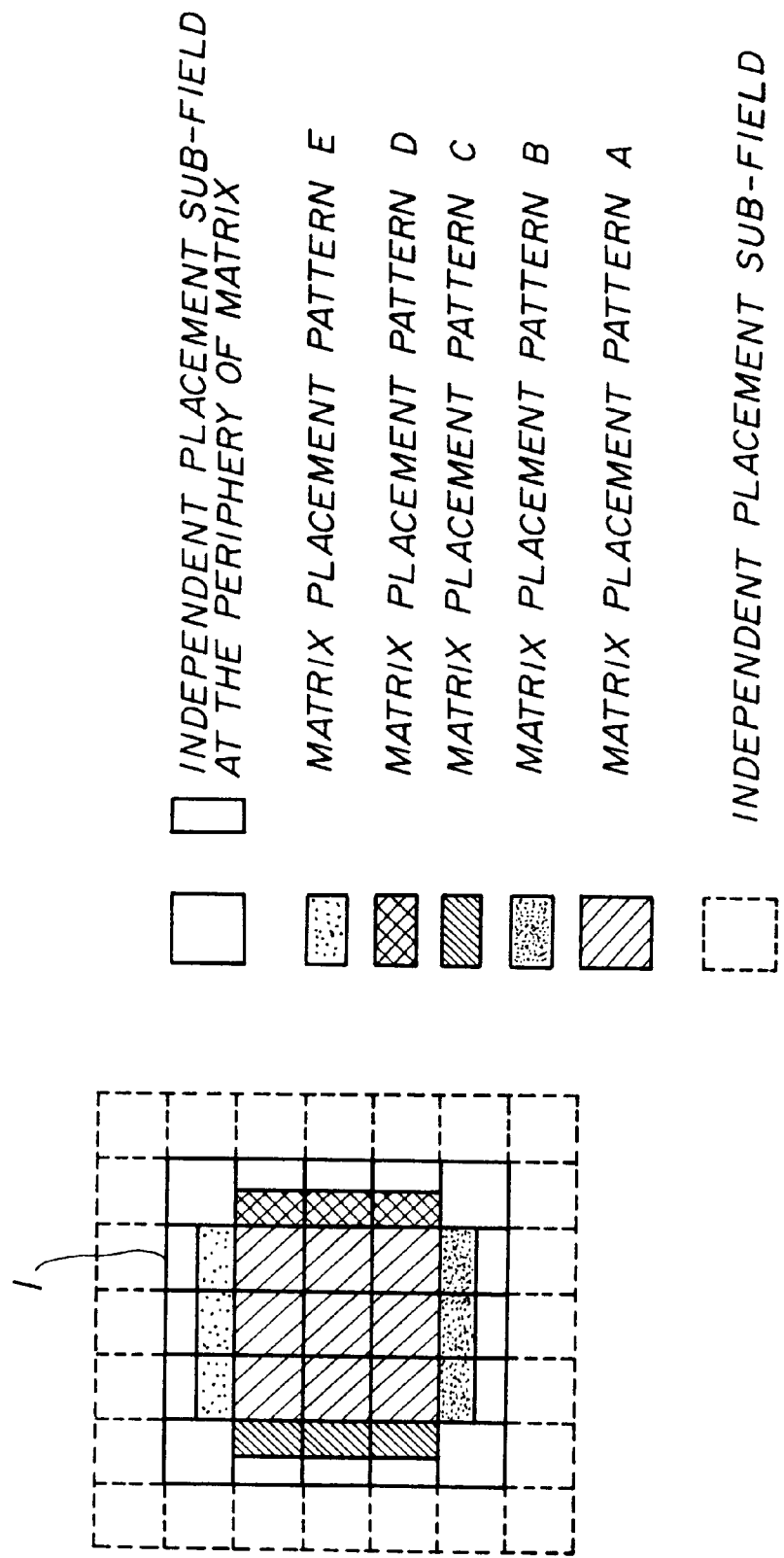
FIG. 1A shows how a field which is to be exposed is divided into sub-fields.
Figure 1B:
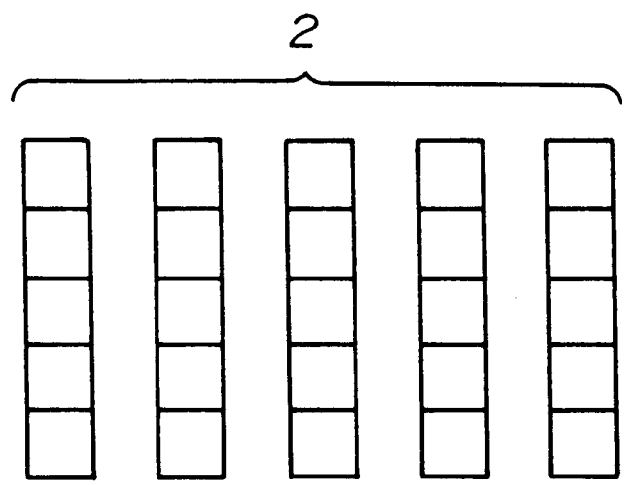
FIGS. 1B and 1C shows how matrix placement patterns are recognized according to the prior art.
Figure 1C:
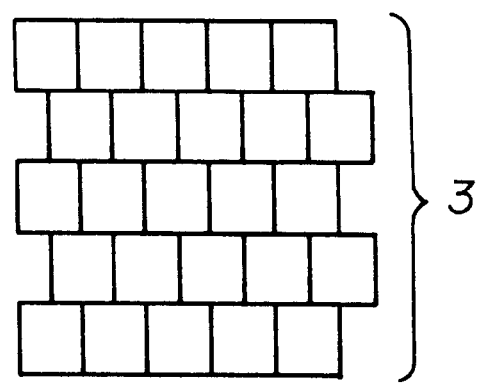

FIGS. 2 through 33 illustrate exposure data preparing apparatuses, exposure data preparing methods and charged particle beam exposure apparatuses according to the present invention.

A description will now be given of a first embodiment. FIG. 2 shows an apparatus for preparing exposure data DOUT based on design data DIN for a semiconductor integrated circuit to be fabricated (hereinafter, referred to as a target LSI). As illustrated, the apparatus comprises a field placement editor 11, a map preparing editor 12, a central processing unit 13 (hereinafter, simply referred to as CPU), a beam dosage calibration unit 14, a supplementary exposure pattern preparing unit 15, an input support tool 16, an input file 17, an intermediate file 18, a beam dosage intermediate file 19, a correction table memory 20, a data conversion editor 21 and an output file 22.

Figure 3A:
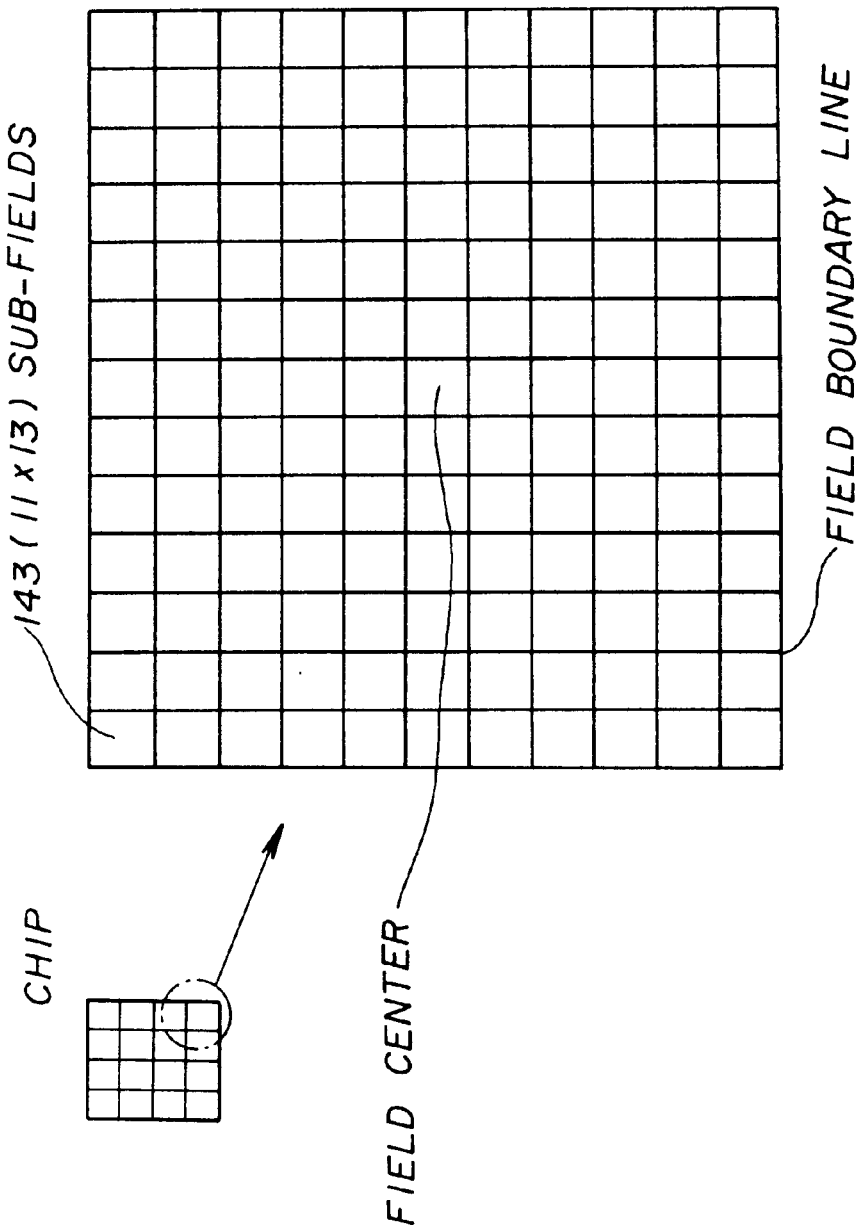
FIG. 3A shows how a pattern placement editor according to the embodiments of the present invention segments a field on a given chip to be exposed into sub-fields.

The field placement editor 11 embodies placement means as claimed. The field placement editor 11 comprises a microprocessor responsible for graphical placement of pattern data D1, and a random access memory (RAM: hereinafter, referred to as a local memory) for temporarily storing the pattern data D1 and supplementary exposure data D5. For example, the editor 11 segments a field on a given chip to be exposed into 143 (11×13) sub-fields, as shown in FIG. 3A. Based on the pattern data D1, the editor 11 places, in this field, singular placement sub-fields, matrix placement sub-fields and temporary singular placement sub-fields, as shown in FIG. 3B. When placing the temporary singular placement sub-fields as shown in FIG. 3B, the field editor 11 ensures that the center of the field as shown in FIG. 3A agrees with the center of the temporary singular placement sub-fields. A field is defined as an area on a semiconductor chip forming a target LSI that is exposed by a beam. The field is segmented into smaller areas called sub-fields that can be covered by a deflection of an electronic beam emitted by an electron beam exposure apparatus. Design data DIN for the target LSI is provided for each sub-field. There are four types of pattern data: singular placement pattern data, matrix placement pattern data, singular placement block pattern data; and matrix placement block exposure pattern data.

The singular placement sub-field is an area in which an exposure pattern is placed by itself. A plurality of exposure patterns are placed in the matrix placement sub-fields. The temporary singular placement sub-field is an area in which a supplementary exposure pattern described later is applied by itself.

The map preparing editor 12 embodies area preparing means as claimed and comprises a microprocessor for segmenting an area based on the pattern data D1, and a local memory for temporarily storing the data D1, D5 and map data D2. For example, the map preparing editor 12 segments the sub-field placed by the field placement editor 11 into areas that can be exposed by a shot of electron beam shot, thus preparing, for example, a total of 625 maps (25×25) as shown in FIG. 4. A map is defined as an area capable of being exposed by a shot of an electron beam emitted by an electron beam exposure apparatus.

In the absence of block exposure data in the design data DIN, a value designated by externally input information (card) becomes a candidate for the size of the map. If block exposure data exists, the maximum exposure area of a block pattern becomes a candidate for the size of the map. If the candidate map size is not obtained by dividing the sub-field sizes X and Y by an integer, the candidate map size obtained by dividing the sizes X and Y by an integer is determined.

For example, assuming that the candidate map size (x×y) is 4.56 [$\mu$m]×4.56 [$\mu$m], that the sub-field size (X×Y) is 110 [$\mu$m]×110 [$\mu$m], and that a spatial margin (hereinafter, referred to as a map admitting area) consisting of surrounding maps that are taken into consideration at the time of revising the spatial ratio (hereinafter, referred to as a beam dosage) of an exposure pattern in the map is 5.00 $\mu$m, the size of a map is set such that multiplying the side of the map by an integer gives 110 $\mu$m. As shown in FIG. 4, the optimum length of the side is 4.4 $\mu$m, to which x and y are set. Depending on the size of the sub-field, the size of the map importing area, and the size of the map, an even number of maps may be generated or an odd number of maps may be generated. Information relating to the resultant 625 maps is stored in the intermediate file 18 as the map data D2, which is used to obtain a beam dosage for each map.

Figure 5:
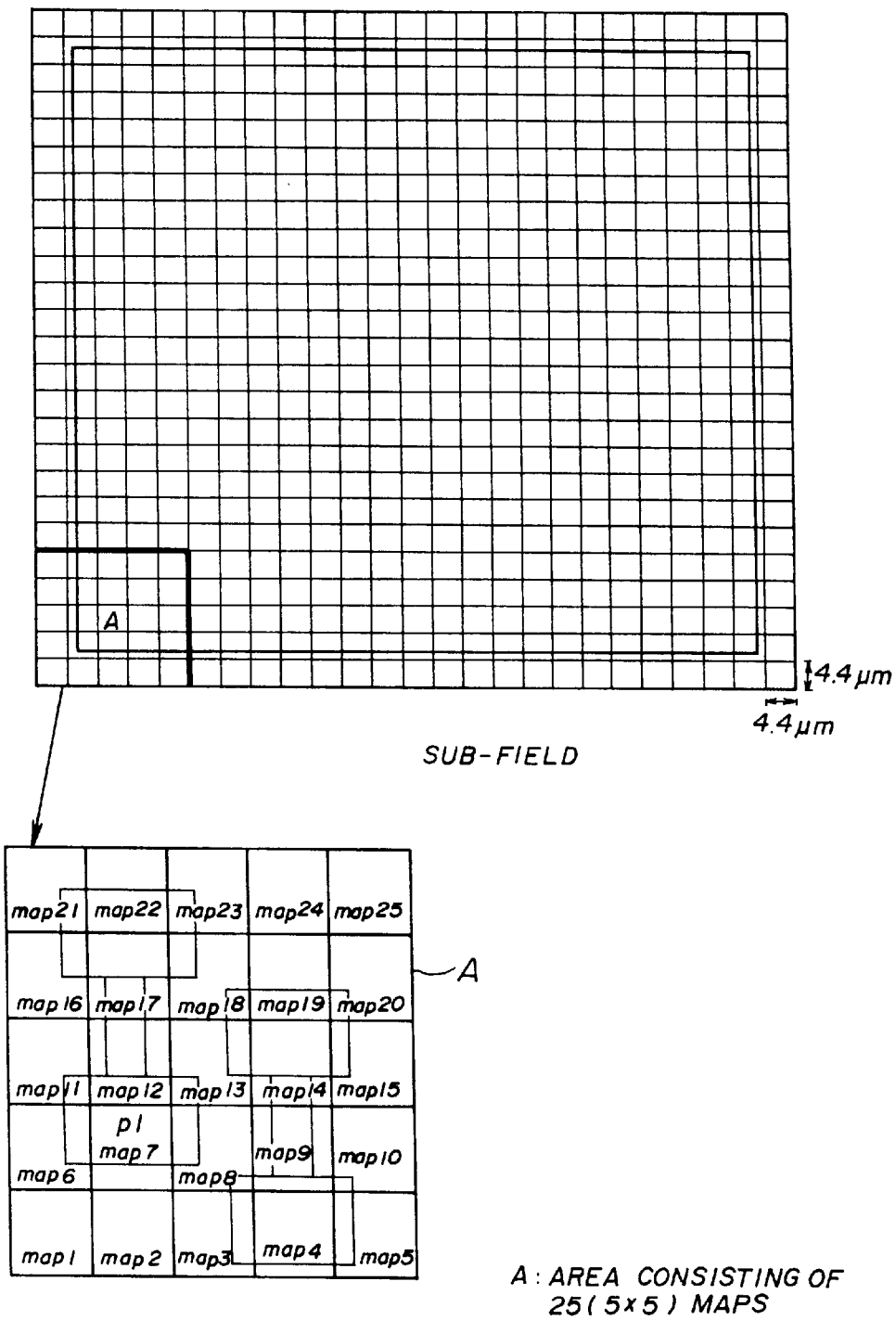
FIG. 5 shows exposure patterns in a singular placement sub-field.
Figure 6:
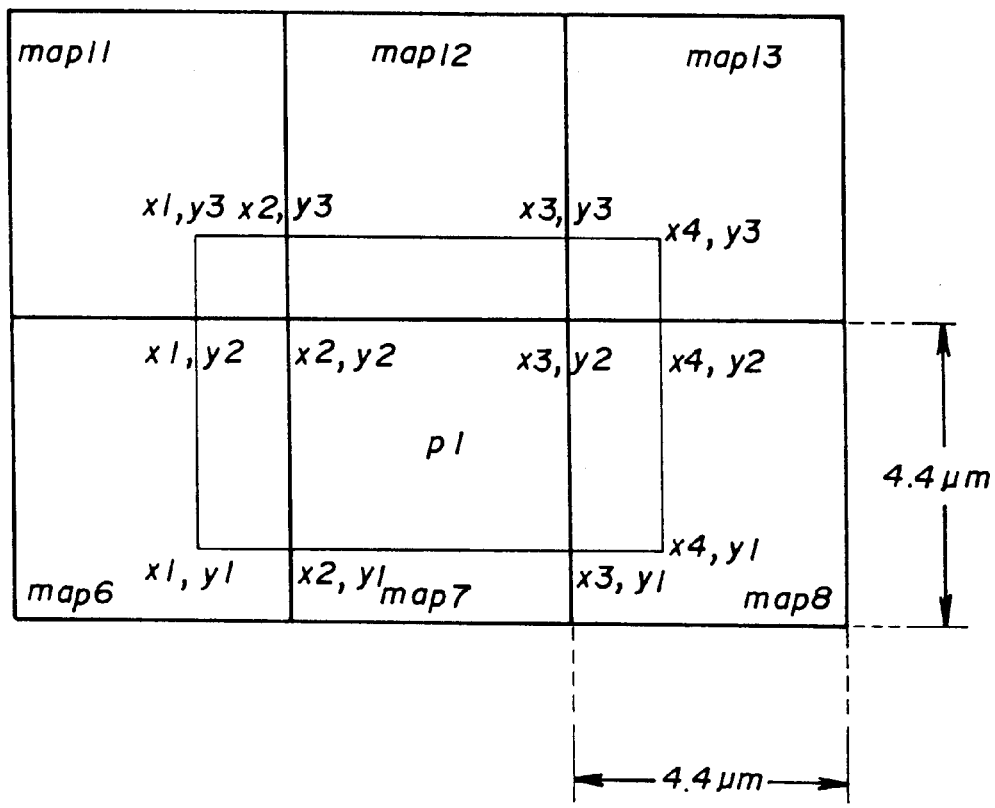
FIG. 6 shows how a beam dosage in a pattern is calculated according to a first embodiment of the present invention.

The CPU 13 embodies computing means as claimed and comprises an operator (ALU) for performing computations based on the map data D2, and a local memory for storing exposure data temporarily. For example, the CPU 13 refers to the pattern specified in the field placement editor 11 so as to determine a dosage of beam applied to an exposure pattern that occupies a map area A consisting of 25 (5×5) maps (map 1–map 25) within the singular placement sub-field as shown in FIG. 5. The CPU 13 thus obtains an electron beam dosage associated with the required beam dosage. The beam dosage data D3 obtained for each map is stored in the beam dosage intermediate file 19.

The CPU 13 calculates a spatial ratio of exposure for each map, based on the size of a map (4.4 $\mu$m×4.4 $\mu$m) and an area in each of the six maps (map 6–map 8, and map 11–map 13) that is occupied by the exposure pattern p.

map 6=(x2−x1)×(y2−y1)/map area
map 7=(x3−x2)×(y2−y1)/map area
map 8=(x4−x3)×(y2−y1)/map area
map 11=(x3−x1)×(y3−y2)/map area
map 12=(x3−x2)×(y3−y2)/map area
map 13=(x4−x3)×(y3−y2)/map area In this way, the beam dosage for each map is determined as a spatial ratio of the exposure pattern occupying a given map. In accordance with the beam dosage, the CPU 13 determines correction ratio _·2 for electron beam dosage.

The CPU 13 refers to a correction table as shown in FIG. 7 and sets the electron beam dosage correction ratio α to a small value when the density (spatial ratio) of the exposure pattern in a given map is high. When the density is low, the correction ratio a is set to a large value.

The correction table is stored in the correction table memory 20. In the correction table, requirement for a supplementary exposure pattern and the correction ratio α applied to basic electron beam dosage are listed in relation to eleven stages of the density of the exposure pattern in the map, where the correction ratio is from 0.1 to 1.0. The correction ratio is read as correction ratio data D6. In this example, it is assumed that level 1 supplementary exposure is required when the exposure pattern density is 0.0–9.5%, level 2 is required for the density 9.5–18.5%, level 3 is required for the density 18.5–27.5%, level 4 is required for the density 27.5–36.5%, and level 5 is required for the density 36.5–45.5%. The correction ratio is set to 1.0 for the stages 1–5. "No supplementary exposure" is specified for the stages 6–11. The correction ratio α is set to 1.0 for the stage 6, 0.8 for the stage 7, 0.6 for the stage 8, 0.4 for the stage 9, 0.2 for the stage 10, and 0.1 for the stage 11

The beam dosage calibration unit 14 embodies calibrating means as claimed. The beam dosage calibration unit 14 comprises a microprocessor for calculating calibration data D4 based on the exposure data D3; and a local memory for storing the data D3, the data D4 and the supplementary exposure data D5 temporarily. For example, the beam dosage calibration unit 14 has a function of integrating the beam dosage of surrounding maps obtained by the CPU 13, along the paths between a map to be calibrated and the surrounding maps removed therefrom by an arbitrary length ε μm so as to calculate a calibration ratio β for calibrating the beam dosage of the surrounding maps (a second preparing apparatus as claimed).

Figure 8:
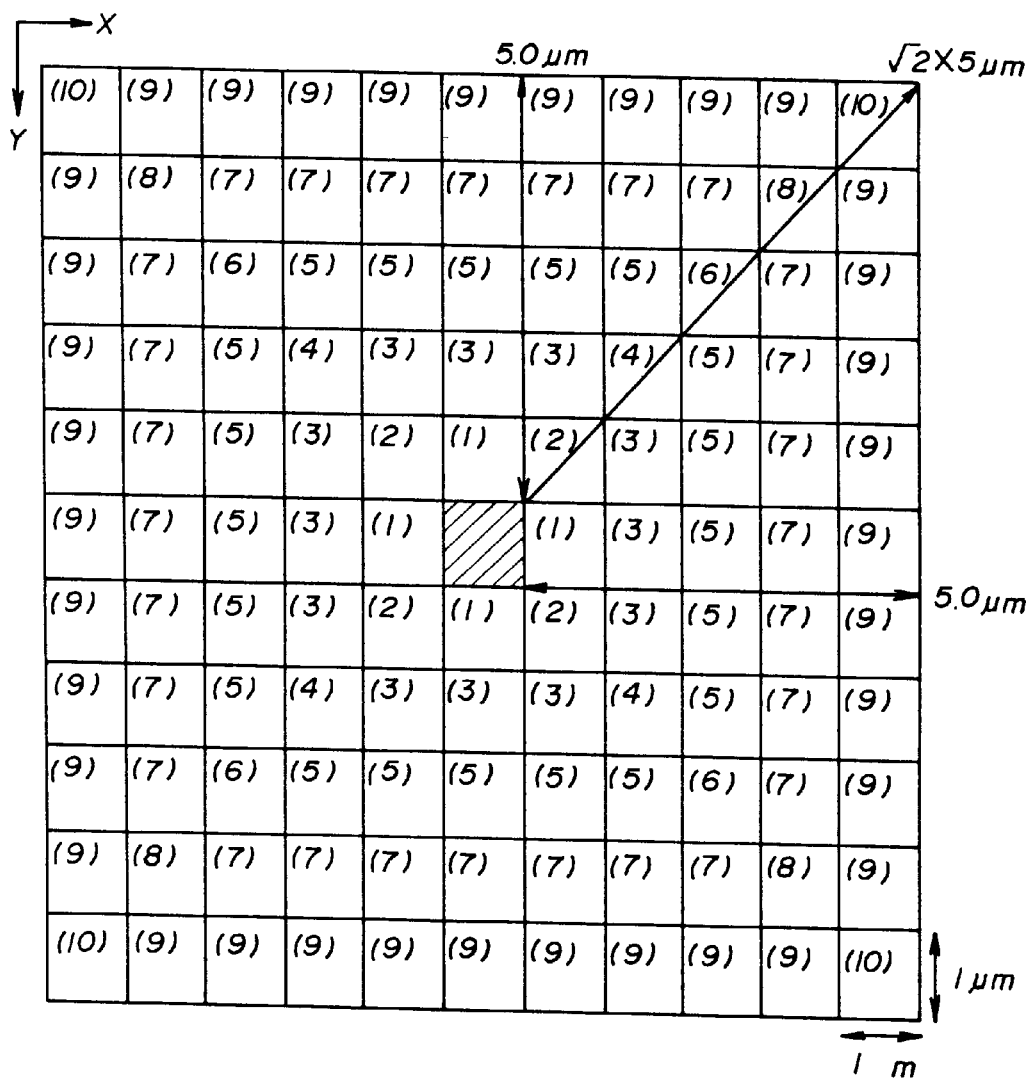
FIG. 8 shows a revision target map and surrounding maps according to the first embodiment.

For example, given a 1 [μm]×1 [μm] revision target map (a map subjected to calibration) as shown in FIG. 8, the beam dosage calibration unit 14 integrates the beam dosage of the surrounding maps determined by the CPU 13, along the paths between the revision target map and the surrounding 120 maps removed therefrom by a maximum distance of 5 μm. In this way, the calibration ratio β for calibrating the beam dosage of the surrounding maps is determined. Thereafter, the beam dosage calibration map 14 is used to convert the calibration ratio β into the ratio for a 4.4 [μm]×4.4 [μm] map.

FIG. 9A shows a result of calculating the calibration ratio β of the beam dosage of the 1 [μm]×1 [μm] map. The calibration ratios β for ten stages (1 through 10) of the exposure distance from the target map indicated by diagonal lines in FIG. 8 are listed. The calculation result of the calibration ratio β is stored in the beam dosage intermediate file 19 as the calibration ratio data D4.

Referring to FIG. 8, assuming that the distance between the map (1) and the revision target map is 1, the distance between the map (2) and the target map is 1.14 (√2 times that of the distance for the map (1)) (see FIG. 9A). The distance between the map (3) and the target map is 2. The distance between the map (4) and the target map is 2.28 (√2 times that of the distance for the map (3)). The distance between the map (5) and the target map is 3. The distance between the map (6) and the target map is 3.42 (√2 times that of the distance for the map (5)). The distance between the map (7) and the target map is 4. The distance between the map (8) and the target map is 4.56 (√2 times that of the distance for the map (7)). The distance between the map (9) and the target map is 5. The distance between the map (10) and the target map is 5.71 (√2 times that of the distance for the map (9)).

Assuming that the beam dosage calibration ratio β derived from the map (1) is 0.9, the calibration ratio β derived from the map (2) is 0.79 (=0.9/√2), as shown in FIG. 9A. Likewise, assuming that the calibration ration derived from the map (3) is 0.8, the calibration ratio β derived from the map (4) is 0.70 (=0.8/√2). Assuming that the calibration ratio derived from the map (5) is 0.6, the calibration ratio derived from the map (6) is 0.53 (=0.6/√2). Assuming that the calibration ratio derived from the map (7) is 0.4, the calibration ratio derived from the map (8) is 0.35 (=0.4/√2). Assuming that the calibration ration derived from the map (9) is 0.2, the calibration ratio derived from the map (10) is 0.17=(0.2/√2).

After calculating the calibration ratio β of the 1 [μm]×1 [μm] map as shown in FIG. 8, the beam dosage calibration unit 14 determines the calibration ratio β for the 4.4 [μm]×4.4 [μm] map which is actually used. A description will be given of this determination with reference to FIG. 10. Obviously, the difference in sizes should be taken into account.

The map admitting area shown in FIG. 8 has a width of 5 μm and a total of 121 (11×11) maps are contained in this area. The 120 maps are bound to the target map in determining the calibration ratio β. In the case of the map admitting area shown in FIG. 10 having a width of 5 μm and including 25 (5×5) maps, the 24 maps bound to the target map in determining the calibration ratio β. For compatibility with the 1 [μm]×1 [μm] map, the beam dosage calibration ratio of the 4.4 [μm]×4.4 [μm] map is divided by 4.4.

For example, while the calibration ratio β derived from the map (1) is 0.9 in the case of the 1 [μm]×1 [μm] map, the corresponding calibration ratio in the case of the 4.4 [μm]× 4.4 [μm] map is 0.20 (=0.9/4.4). Likewise, while the calibration ratio β derived from the map (2) is 0.79 in the case of the 1 [μm]×1 [μm] map, the corresponding ratio in the case of the 4.4 [μm]×4.4 [μm] map is 0.17 (=0.79/4.4). The calibration ratio β derived from the map (3) is 0.80 in the case of the 1 [μm]×1 [μm] map, and the corresponding ratio in the case of the 4.4 [μm]×4.4 [μm] map is 0.18 (=0.8/4.4). The calibration ratio derived from the map (4) in the case of the 1 [μm]×1 [μm] map is 0.70, and the corresponding calibration ratio in the case of the 4.4 [μm]×4.4 [μm] map is 0.15 (=0.70/4.4).

Figure 11:
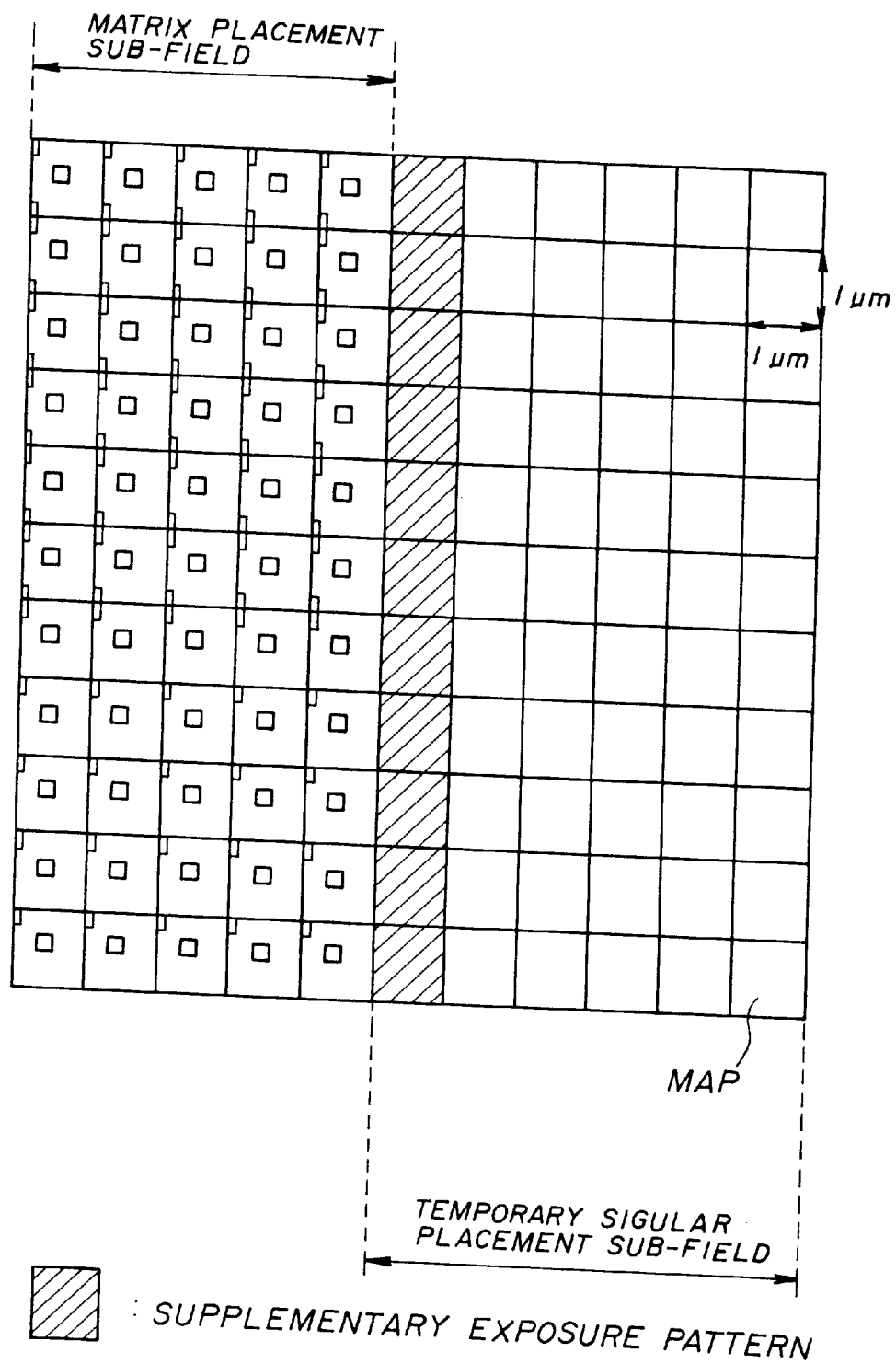
FIG. 11 explains a function of a pattern preparing unit according to the embodiments of the present invention.

The supplementary exposure pattern preparing unit 15 embodies pattern preparing means as claimed. The supplementary exposure pattern preparing unit 15 comprises a microprocessor for restraining preparation of the supplementary exposure data D5 based on the beam dosage data D3; and a local memory for storing the data D3 and D5 temporarily. For example, the pattern preparing unit 15 has a function of preparing a supplementary exposure pattern applied to an area adjacent to maps as shown in FIG. 11, based on the density of the exposure pattern in the maps (a third preparing unit). The level 1 through level 5 supplementary exposure as indicated in FIG. 7 may be prepared. The supplementary exposure is applied in order to compensate for an insufficiency in the basic electron beam dosage.

A supplementary exposure pattern is prepared in such a manner as to correspond to the size of a map. When the supplementary exposure pattern is prepared, the supplementary exposure data D5 is transferred to the editors 11, 12, 14 and 21. FIG. 11 shows an example where a supplementary exposure pattern is applied to the temporary singular placement sub-field adjacent to the matrix placement sub-field. The supplementary exposure pattern serves to correct the proximity effect. The supplementary exposure pattern may also be applied within the singular placement sub-field or between the supplementary exposure patterns. The proximity effect refers to blurred exposure occurring as a result of a closeness between a large pattern and a small pattern. For example, if large exposure pattern such as that for a contact hole is near a small wiring pattern, edges of the wires may become round due to the proximity effect. The smaller the distance between the patterns, the greater the proximity effect.

The input support tool 16 comprises a card processing unit, a keyboard or the like. The input support tool 16 sets parameters necessary for data processing based on the externally input data D7. The card processing unit specifies the size of the map using a card, or specifies the processed layer of the designed LSI for which the exposure data is prepared. The parameters set by the input support tool 16 include a parameter relating to calculation equations employed in a self-correcting process; the name of a processed layer; the size of the map; and information relating to stages of density.

The input file 17 is a memory for storing design data for the LSI to be fabricated. The intermediate file 18 contains information relating to processed layers of the LSI designed; information relating to block exposure data; and information relating to fields; information relating to sub-field. Sub-field information include the sub-field center position x coordinate and Y coordinate; the data transfer start address; the number of types of pattern data; and the head address in the file.

The beam dosage intermediate file 19 stores the field number, the sub-field center position X and Y coordinates, the positions x and y of the map in the sub-field, and the beam dosage represented in %. The file 19 stores the calibration ratio data D4 of the beam dosage of the map.

The data conversion editor 21 has a function of converting the corrected pattern data D1 into the exposure data DOUT adapted for the electron beam exposure apparatus. The output file memory 22 stores the exposure data DOUT from the data conversion editor 21. A data bus 23 connects the field placement editor 11, the map preparing editor 12, the CPU 13, the beam dosage calibration unit 14, the supplementary exposure pattern preparing unit 15, the input support tool 16, the input file 17, the intermediate file 18, the beam dosage intermediate file 19, the correction table memory 20, the data conversion editor 21 and the output file 22. The above-described components constitute the exposure data preparing apparatus according to the present invention.

A description will now be given, with reference to FIGS. 14–26, of the operation of the exposure data preparing apparatus according to the first embodiment. The description given below assumes that block exposure data is contained in the design data DIN, and a matrix placement sub-field exists in the target field subjected to beam dosage correction. Since it is difficult to give a description for all the sub-fields in the chip, the description below is limited to only a portion of the chip.

Figure 14:
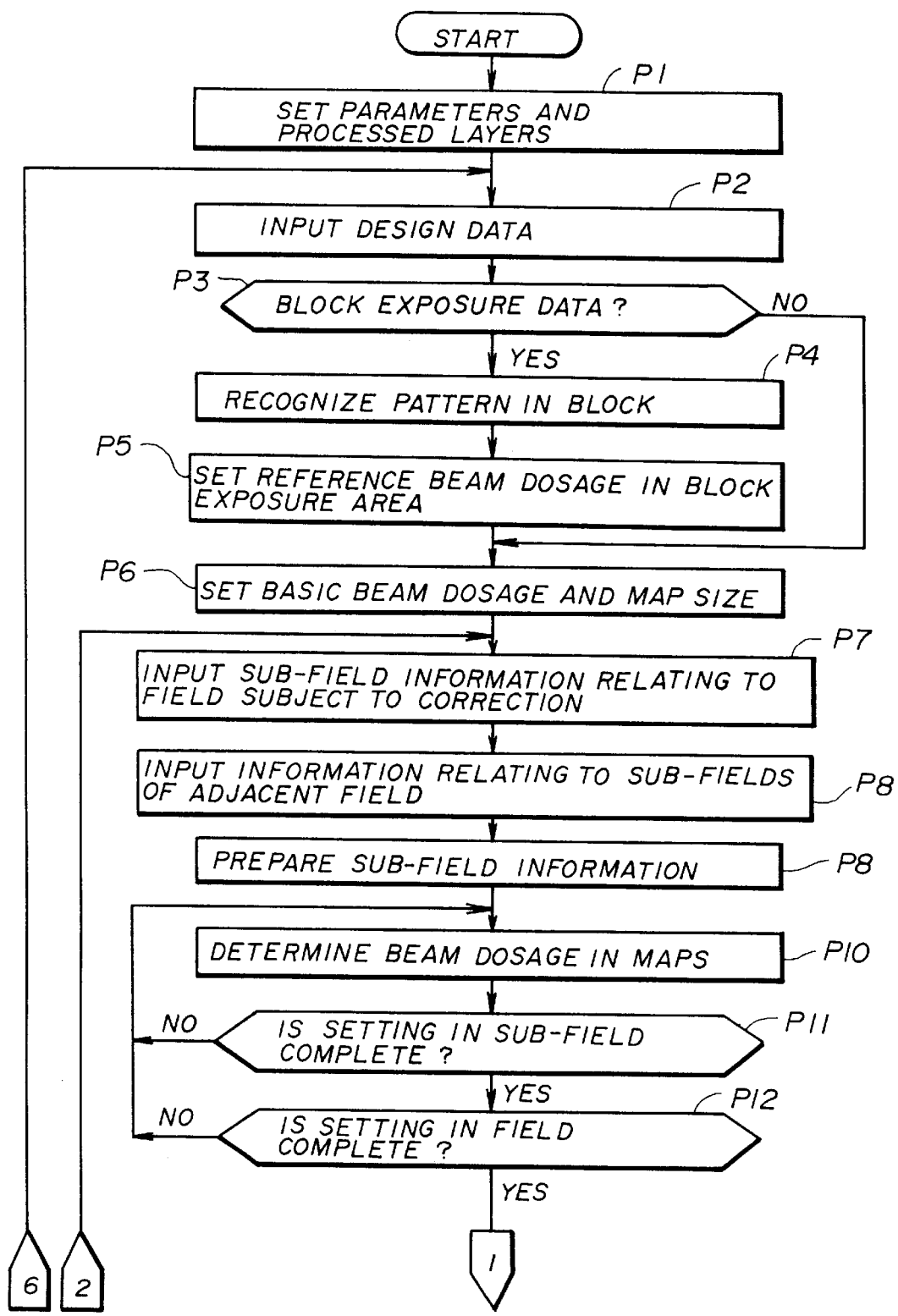
FIG. 14 is a flowchart (part 1) showing exposure data preparation according to the embodiments of the present invention.
Figure 15:
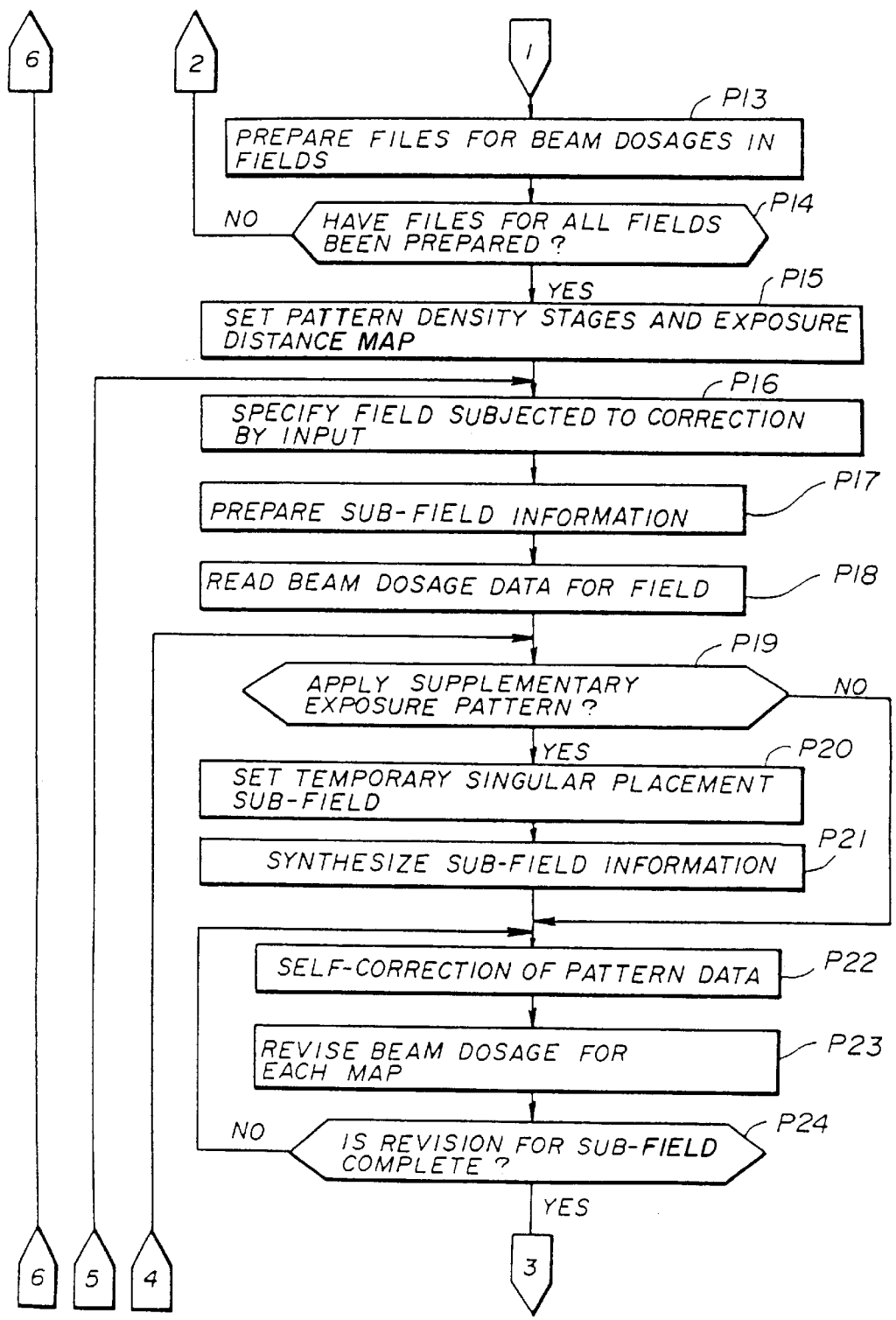
FIG. 15 is a flowchart (part 2) showing exposure data preparation according to the embodiments of the present invention.

Referring to FIG. 14, in step P1, parameters necessary for preparation of the exposure data are set and names of the processed layers of the LSI designed are set. The exposure data preparing apparatus according to the first embodiment is constructed such that, when the card processing part of the input support tool 16 specifies a processed layer of the actually designed LSI, the externally input data D7 is transferred to the CPU 13. The CPU 13 then sets the parameters. The parameters set by the CPU 13 include a parameter relating to calculation equations employed in a self-correcting process; processed layer names describing memories and peripheral circuits for the LSI designed; the size of the map; and information identifying stages of density of the exposure pattern.

Figure 12:
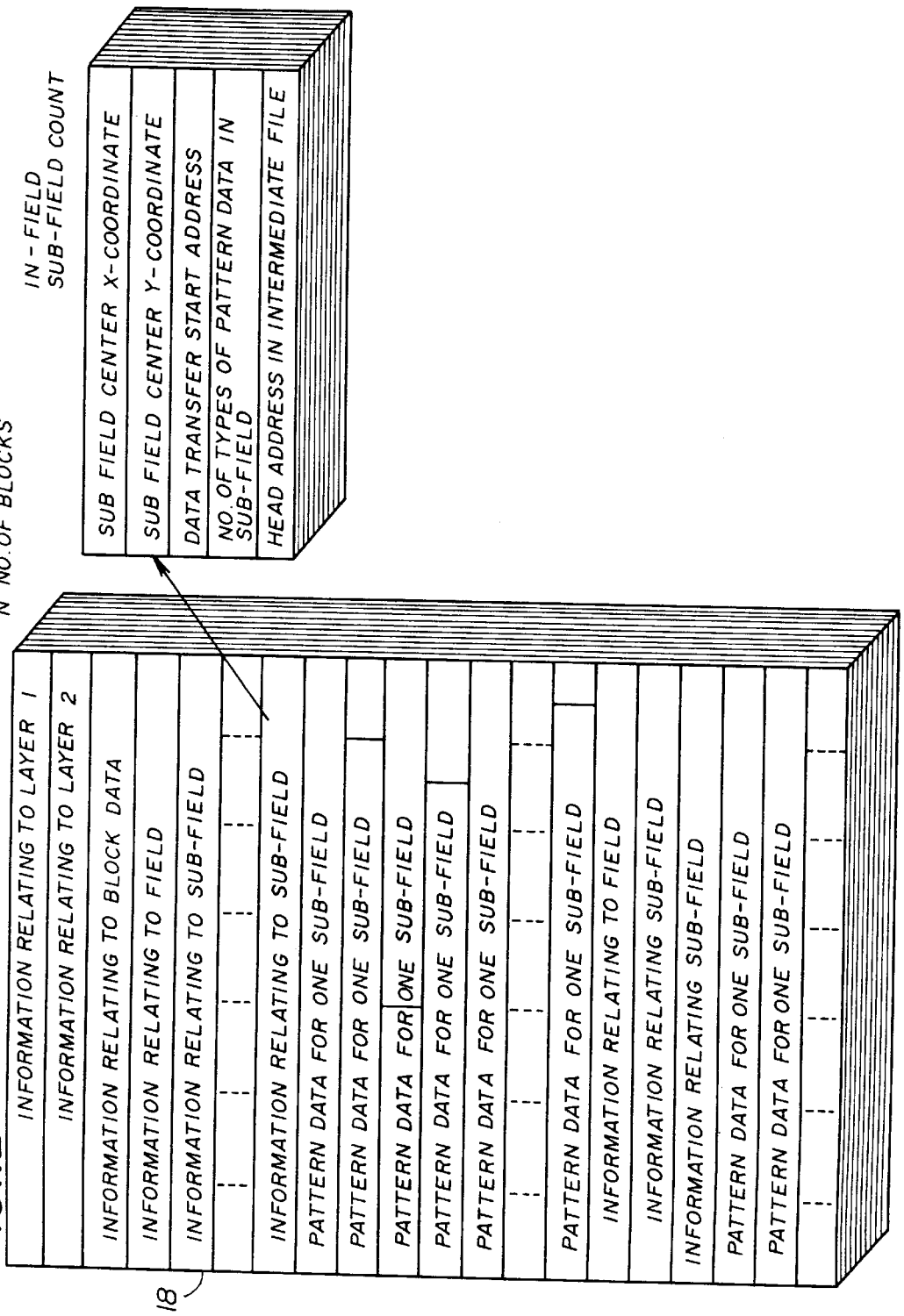
FIG. 12 shows a content of an intermediate file according to the embodiments of the present invention.

In step P2, the design data DIN for the LSI designed is input. The design data DIN specified first is retrieved from the input file 17 so that the necessary pattern data D1 is transferred to the intermediate file 18. For easiness of correction of the pattern data D1 and for efficient transfer of the data, the pattern data D1 is converted so as to have a format as shown in FIG. 12. The converted data is stored in the intermediate file 18. The writing is conducted for all the pattern data D1 in the processed layers of the LSI designed. The field placement editor 11 places sub-fields (for example, 110 [$\mu m$]×110 [$\mu m$] sub-fields) in a field.

Next, in step P3, a determination is made as to whether or not block exposure data is contained in the design data DIN. If a negative answer is yielded in P3, then determination is made as to whether or not a matrix placement sub-field exists in each field. Since there are cases where neither block exposure data nor a matrix placement sub-field is present, an examination into the spatial arrangement of the sub-fields is made.

Possible arrangements of the sub-fields include the following cases:

(1) Only singular placement sub-fields are present.

(2) Singular placement sub-fields and matrix placement sub-fields are present.

(3) Block exposure data is contained, and only singular placement sub-fields are present.

(4) Block exposure data is contained, and only matrix placement sub-fields are present.

(5) Block exposure data is contained, and both matrix placement sub-fields and singular placement sub-fields are present.

Block exposure data contained in the design data DIN is stored in the intermediate file 18. If block exposure data is absent, the control is turned over to step P6.

Figure 17A:
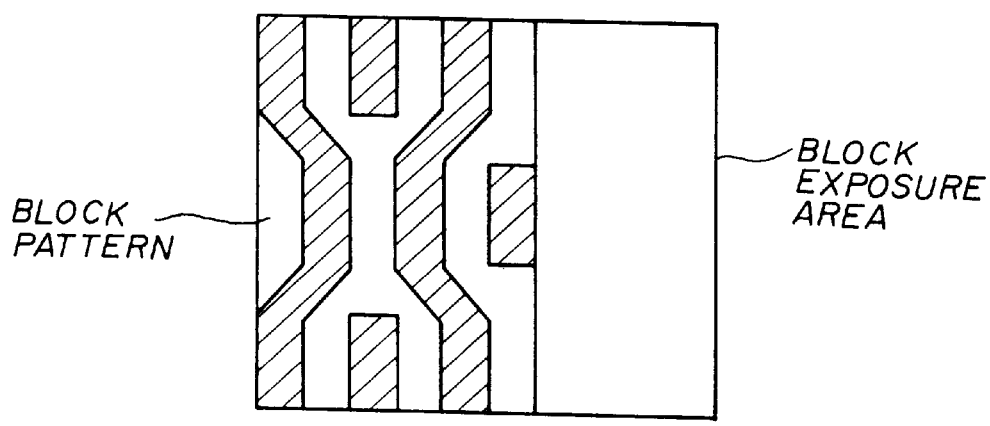
Figure 17B:
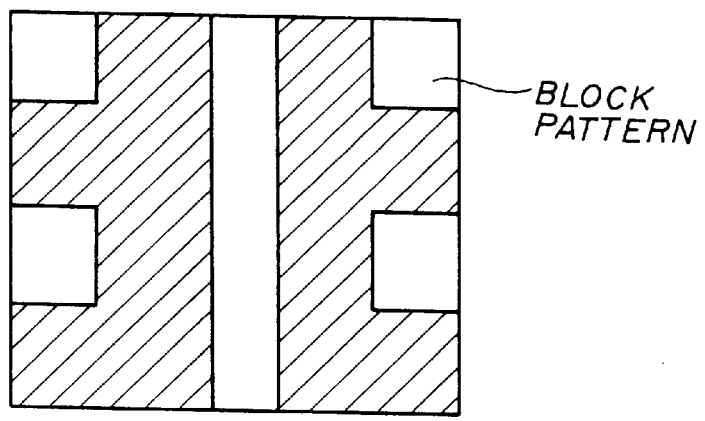

Since the design data DIN of the first embodiment contains block exposure data, a determination is made in step P4 as to whether or not a block exposure pattern exists in a block exposure area. In this determination, all the pattern data D1 relating to the block exposure pattern is retrieved from the intermediate file 18 in order to provide an accurate measure of the beam dosage of the maps. A determination that block exposure data is present is given not only when a block exposure pattern occupies the entirety of the block exposure area, as shown in FIG. 17B but also when a block pattern does not occupy the entirety of the block exposure area, as shown in FIG. 17A. The size of the pattern is recognized based on the minimum coordinate value of the starting position of the block exposure pattern and the maximum coordinate value of the ending point of the block exposure pattern. The size that provides the largest exposure area of the block pattern becomes a candidate for the map size.

For example, when there are three consecutive block patterns that do not occupy the entirety of the block exposure, the size of the block exposure area indicated by a solid line is specified as the size of the map. As indicated in FIG. 17C, the beam dosage for each map is determined by determining the size of the map and the size of an area (hereinafter, referred to as an exposure pattern area) occupied by the block pattern in the map. The beam dosage data D3 for the map is stored in the beam dosage intermediate file 19.

Once the exposure pattern area is determined, an reference beam dosage in the block exposure area is set in step P5. The reference beam dosage is a threshold value against which it is determined whether or not the supplementary exposure pattern is to be applied. The reference beam dosage is determined by converting an in-block area associated with the block exposure data into the exposure pattern area.

For example, an average of a maximum exposure pattern area and a minimum exposure pattern area for each block pattern is determined. The determined average is set as the reference beam dosage. On the basis of the reference beam dosage, stages of the pattern density are set. In this embodiment, eleven stages 1–11 of pattern density as shown in FIG. 7 are set. In FIG. 7, it is assumed that the pattern density of 50% is associated with the reference exposure data. The number of stages of the pattern density as defined by the card processing unit may be used to determine the number of stages to be established between the pattern density of 0% and that of 100%.

The above-described data processing is applied to a case where the block exposure data is present, In the case where the block exposure data is absent, the setting of the reference beam dosage and the stages of the pattern density are carried out in step P15. This arrangement applies to a case where only the matrix placement sub-field is present, a case where only the singular placement sub-field is present, and a case where the singular placement sub-field and the matrix placement sub-field are present.

In step P6, the basic dosage of an electron beam and the size of a map are set. The basic dosage is determined according to the width or length of the exposure pattern, or the sensitivity of the electron beam resist maternal. The map preparing editor 12 segments the sub-field into areas having a size covered by a shot of an electron beam. That is, the sub-field is segmented into areas having a size of the block exposure area. For example, as a total of 625 (25×25) units each having sides as long as 4.4 μm are prepared in the sub-field having sides as long as 110 μm as shown in FIG. 4. The map admitting area used when the beam dosage is revised is set to have a width of 5 μm. When an odd number of maps are to be prepared, the sub-field center and the map center are to be aligned, as shown in FIG. 4.

Figure 18A:
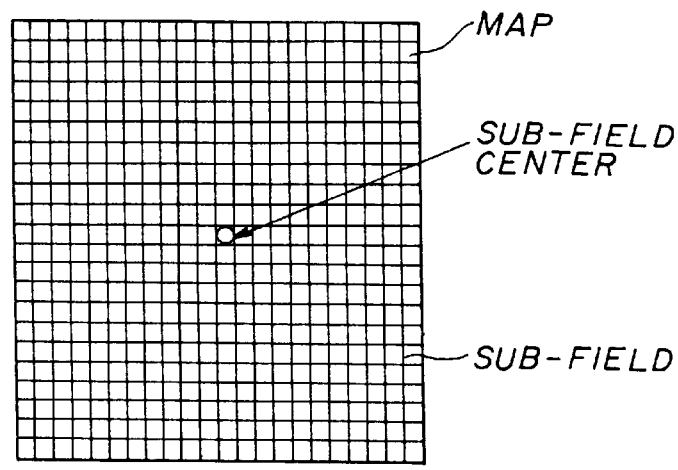
FIG. 18A shows an even number of maps according to the embodiments of the present invention.

If an even number of maps are to be prepared in a 110 [μm]×110 [μm] sub-field, a total of 484 (22×22) maps are prepared by setting the size of the map to 5 μm, as shown in FIG. 18A. In the event that an even number of maps are prepared, it is ensured that the coordinate of the bottom left corner of the central map and the sub-field center coincide. A total of 12100 (110×110) maps are prepared if each of their sides has a length of 1 μm.

Figure 18B:
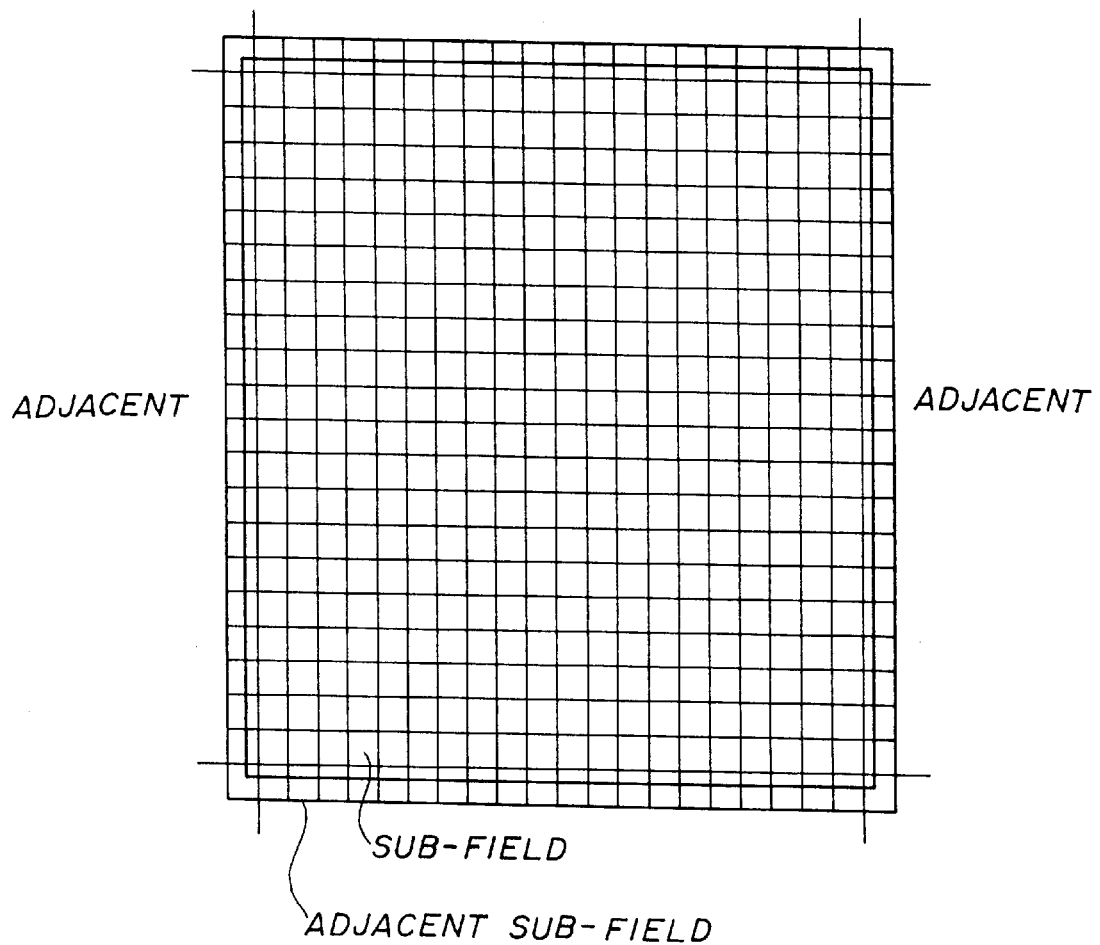
FIG. 18B shows a correction target field according to the embodiments of the present invention.
Figure 20A:
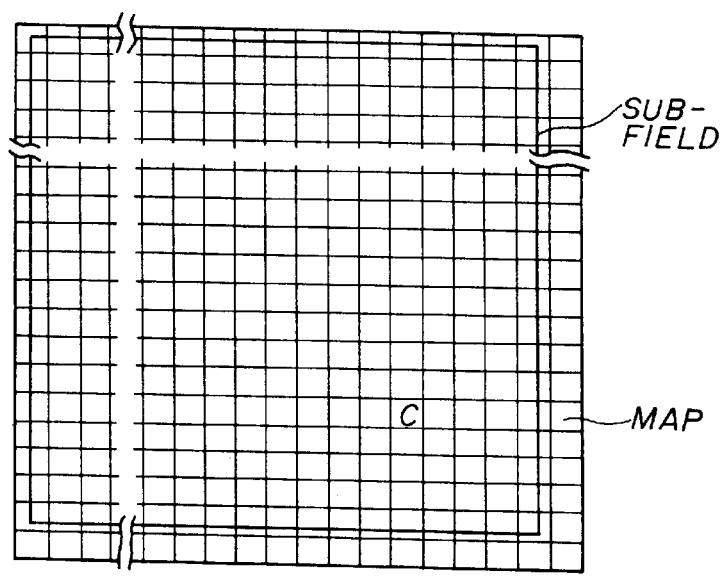
FIGS. 20A, 20B and 20C explain a block exposure pattern on maps according to the embodiments of the present invention.

Information relating to the map is stored in the intermediate file 18 as the map data D2. In the following description, it is assumed that the size of the map is 4.4 μm When the data processing up to step P6 is completed, the sub-field information for the field subjected to correction is input. In this process, the information relating to all the sub-fields in the field subjected to correction is read out and transferred to the field placement editor 11. The sub-field information includes the sub-field center position X coordinate and Y coordinate; the data transfer start address; the number of types of pattern data; and the head address in the file. As shown in FIG. 18B, the field placement editor 11 segments the field to be exposed into 40 (20×20) sub-fields. According to the pattern data D1, the matrix placement pattern as shown in FIG. 20A is placed.

Further, in step P8, information relating to the sub-fields (adjacent sub-fields) of the field (adjacent field) surrounding the target field subjected to beam dosage correction is read. The sub-map admitting area having the width ε μm (5 μm in this embodiment) is set in the sub-fields in the field subjected to correction. All the information relating to these sub-fields included in this area is read out from the intermediate file 18 and transferred to the field placement editor 11. The center position X coordinate and Y coordinate of the adjacent sub-fields are converted so as to fit the coordinate system of the field subjected to correction.

Next, in step P9, sub-field information relating to the sub-fields in the field subjected to correction and relating to the adjacent sub-fields are prepared. The sub-field information is used to determine the order in which the pattern data D1 is corrected. The sub-field information is prepared in the same format as shown in FIG. 12. The sub-field information relating to the sub-fields in the field subjected to correction, and the sub-field information relating to the adjacent sub-fields are prepared separately. Information relating to sub-fields in the field subjected to correction is referred to as sub-field sub-field information, and information relating to the adjacent sub-fields is referred to as adjacent sub-field sub-field information.

Next, in step P10, a beam dosage for each map prepared in the sub-fields is determined. In this process, the pattern data D1 for the sub-field is read out according to the head address of the sub-field information in the intermediate file 18. The data D1 is transferred to the CPU 13. Likewise, the pattern data for the sub-field is read from the adjacent sub-field sub-field information and is transferred to the CPU 13. The beam dosage for the exposure pattern that occupies the 5×5 map area A in the singular placement sub-field shown in FIG. 5 is determined by the CPU 13 for each of the maps. The CPU 13 also determines the electron beam dosage associated with the beam dosage of each exposure pattern. The computation of the beam dosage is conducted for all the sub-fields in all the fields.

Figure 19A:
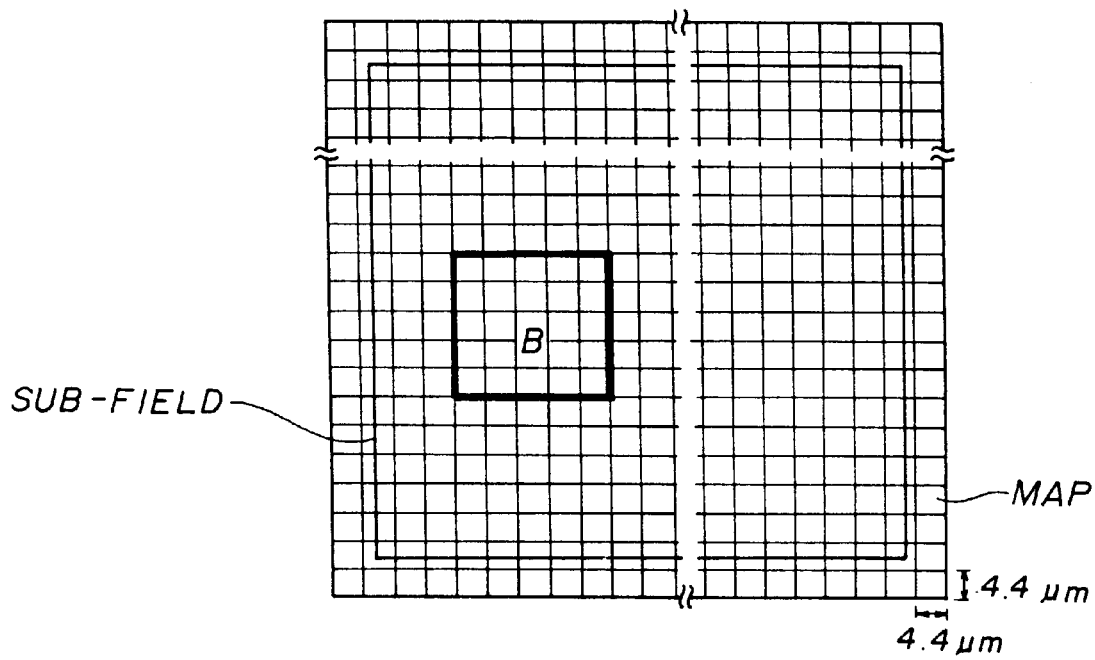
Figure 19B:
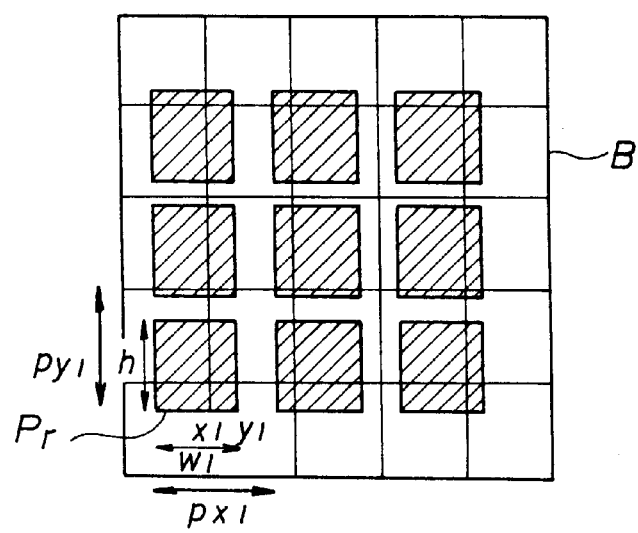

As for the beam dosage of the matrix placement pattern placed on the sub-field consisting of maps as shown in FIG. 19A, the beam dosage of the reference matrix placement pattern Pr is determined using one of the 9 (3×3) matrix placement patterns in the area B shown on an enlarged scale in FIG. 19B. The determined beam dosage and the matrix placement information as shown in FIG. 19C are used repetitively to compute the beam dosage of the remaining 8 matrix patterns.

Referring to FIG. 19C, the matrix placement information includes a matrix identification flag, the number of repetitions in the X direction, the number of repetitions in the Y direction, the repetition pitch px1 in the X direction, and the repetition pitch py1 in the Y direction. The reference matrix placement pattern data Pr includes the pattern shape, the beam dosage, the start position coordinates x1 and y1, the height h of the pattern, and the width w of the pattern.

Figure 20B:
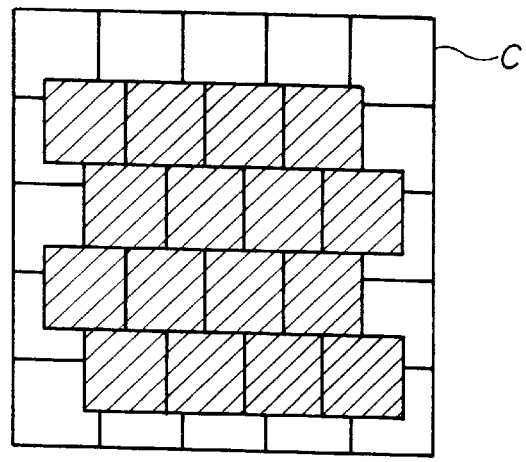
Figure 20C:
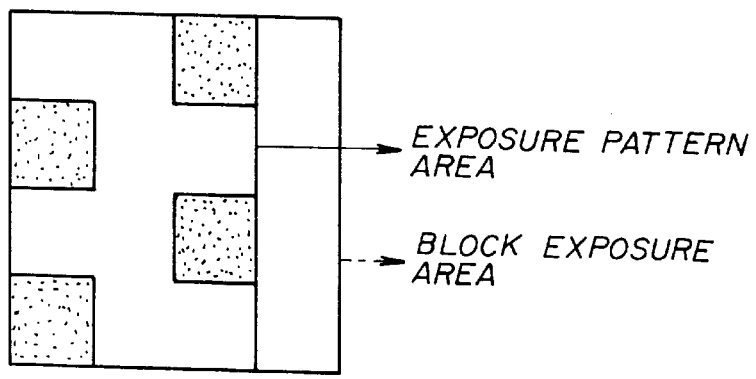

The block exposure pattern placed in the maps in the sub-field as shown in FIG. 20A is determined as follows. Referring to FIG. 20B which shows the area C on an enlarged scale, it is assumed that the 16 (4×4) block exposure patterns are placed. One of the block exposure patterns is shown in FIG. 20C. The beam dosage PS for each map is determined as per $$PS = BS \times (PPS/BBS)$$

where BBS denotes an area of one block exposure area, PPS denotes an area occupied by an exposure pattern in one block exposure area, BS denotes a total area of the 16 block exposure areas.

Figure 21A:
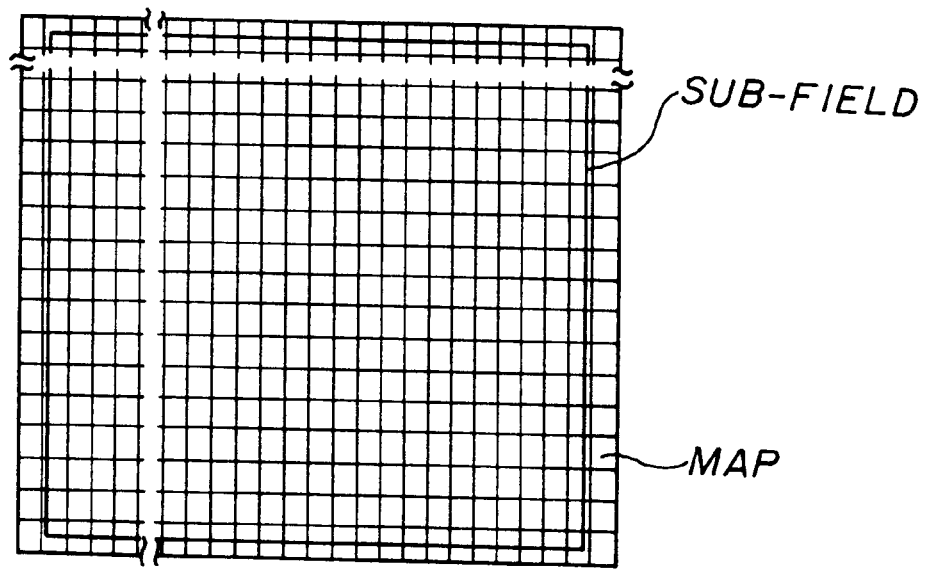
FIGS. 21A, 21B and 21C explain a matrix placement block exposure pattern on maps according to the embodiments of the present invention.
Figure 21B:
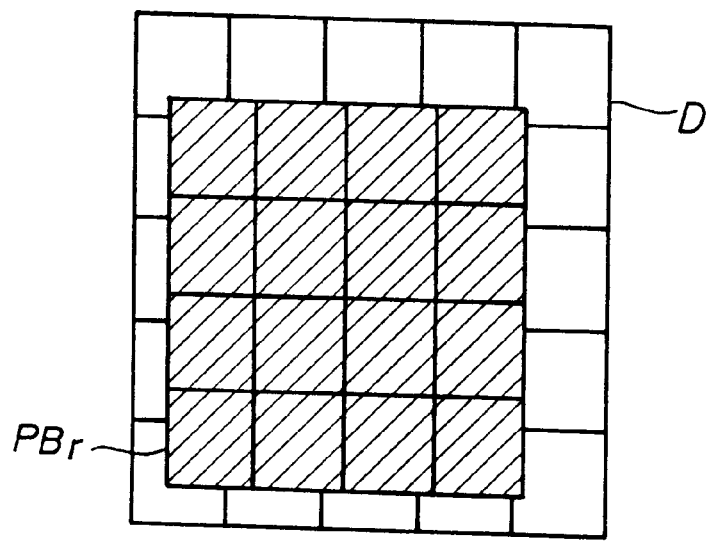

The beam dosage of the matrix placement block exposure pattern placed on the maps in the sub-field as shown in FIG. 21A is determined as follows. Referring to FIG. 21B which shows the area D on an enlarged scale, it is assumed that the 16 (4×4) matrix placement block exposure patterns are placed. The reference matrix placement block exposure pattern PBr is determined by using one of the matrix placement block exposure patterns. The determined beam dosage and the matrix placement block exposure information as shown in FIG. 21C are used repeatedly to compute the beam dosage of the remaining 15 matrix placement block exposure patterns.

Figure 21C:
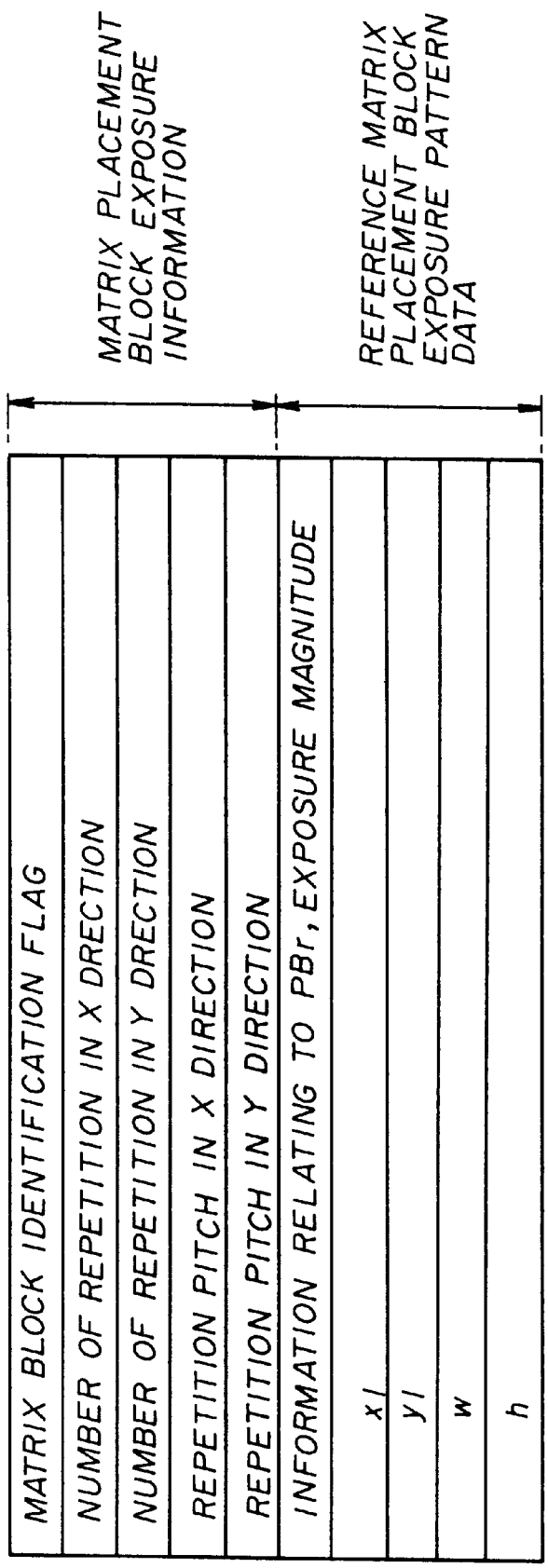

Referring to FIG. 21C, the matrix placement block exposure information includes a matrix identification flag, the number of repetitions the X direction, the number of repetitions in the Y direction, the repetition pitch in the X direction, the repetition pitch in the Y direction. The reference matrix placement block exposure pattern PBr includes the shape of the pattern, the beam dosage of the pattern, the start position coordinates x1 and y1, the height h of the pattern, and the width w of the pattern.

The beam dosage data D3 obtained by the CPU 13 is transferred to the beam dosage intermediate file 19. Non-rectangular patterns that may occur in the singular placement pattern or the matrix placement pattern will be described in a third embodiment.

In step P11, a determination is made as to whether or not the beam dosage for all the maps in the sub-field has been set. If the beam dosage has not been set for all the maps, that is, if a negative answer is yielded in P11, the control is returned to step P10. If the beam dosage has been set for all the maps in the sub-field, that is, if an affirmative answer is yielded in step P10, the control is turned over to step P12, wherein a determination is made as to whether or not the beam dosage for all the fields has been determined. If the beam dosage for all the fields in a chip has been determined, that is, an affirmative answer is yielded in step P10, the control is turned over to step P2, whereupon the processes in steps P2 through P10 are repeated.

In step P13, the beam dosage file for all the fields in the chip is prepared. The beam dosage file has a format by which the computation results of the beam dosage for all the fields is written, field by field, in the beam dosage intermediate file 19 as the beam dosage data D3. The beam dosage data D3 has the format as shown in FIG. 13.

Thereafter, in step P14, a determination is made as to whether or not beam dosage files for all the fields have been made. If the files have been prepared, that is, if an affirmative answer is yielded in step P14, the control is turned over to step P15. If not all the files have been prepared, that is, if a negative answer is yielded in step P14, the control is returned to step Di, whereupon the processes in steps P7 through P14 are repeated.

Once the beam dosage for the maps in all the fields has been determined, pattern density stages for obtaining the correction ratio a for a basic electron beam dosage, and the exposure distance map are prepared in step P15. It is to be noted that the pattern density stages have already been set in step P5 in the case where the design data DIN contains the block exposure pattern data. The pattern density stages are obtained in step P15 only when the block exposure pattern is not present, that is, in the case where the matrix placement sub-field exists, or in the case where the singular placement sub-field exists.

As has already been illustrated in FIG. 7, eleven pattern density stages (stage 1 through stage 11) are set. The reference beam dosage serves as a threshold dosage level against which a determination as to whether or not a supplementary exposure pattern is to be applied in the matrix placement sub-field or in the singular placement matrix sub-field. A maximum beam dosage and a minimum beam dosage in the maps in the reference matrix placement sub-field in the entirety of the chip are determined and an average thereof is obtained. When the matrix placement sub-field is not present, a maximum beam dosage and a minimum beam dosage in the maps in the entire chip are determined, and an average thereof is set as the reference beam dosage.

Once the pattern density stages are set, the exposure distance map which relates the beam dosage to distances between maps is prepped. The exposure distance map is used in a revision process for revising the beam dosage for the map subjected to correction. The exposure distance map is used such that the calibration ration $\beta$ for the 1.0 $[\mu m] \times 1.0$ $[\mu m]$ map as shown in FIG. 8 is determined first and then the calibration ratio $\beta$ for the 4.4 $[\mu m] \times 4.4$ $[\mu m]$ is determined by conversion. The calibration ratio $\beta$ for the 1.0 $[\mu m] \times 1.0$ $[\mu m]$ map is obtained by integrating the beam dosage of surrounding maps along the paths between a map to be calibrated and the surrounding maps removed therefrom by a maximum length 5 $\mu$m in the X direction or the Y direction so as to calculate a calibration ratio $\beta$ for calibrating the beam dosage of the surrounding maps. FIG. 9A explains the calibration ratio $\beta$ for the 1.0 $[\mu m] \times 1.0$ $[\mu m]$ map, and FIG. 9A explains the calibration ratio $\beta$ for the 4.4 $[\mu m] \times 4.4$ $[\mu m]$ map. The computation results as shown in FIGS. 9A and 9B are stored as the calibration ratio data D4 in the beam dosage intermediate file 19.

In step P16, the field to be subjected to correction is specified by an input. Sub-fields adjacent to the field subjected to correction are not taken into consideration. This is because the map admitting area having the width of 5 $\mu$m has already been set in step P8 and the beam dosage for the maps have been obtained using the pattern data in the adjacent sub-fields. When the beam dosage is revised, the beam dosage data D3, instead of the pattern data D1. In other words, the beam dosage in the maps is used in the revision.

In step P17, the sub-field information in the field subjected to correction is prepared. The order in which the pattern data D1 in the sub-field is corrected is set. In step P18, the beam dosage data D3 for all the sub-fields in the field is read from the beam dosage file 19.

In step P19, a determination is made as to whether or not it is necessary to apply a supplementary exposure pattern in the presence of the block exposure pattern or the matrix placement sub-field. If it is necessary to apply a supplementary exposure pattern, that is, if an affirmative answer is yielded in step P19, a temporary singular sub-field is set in step P20. If it is not necessary to apply the supplementary exposure pattern, that is, if a negative answer is yielded in P19, the control is turned over to step P22.

Figure 22A:
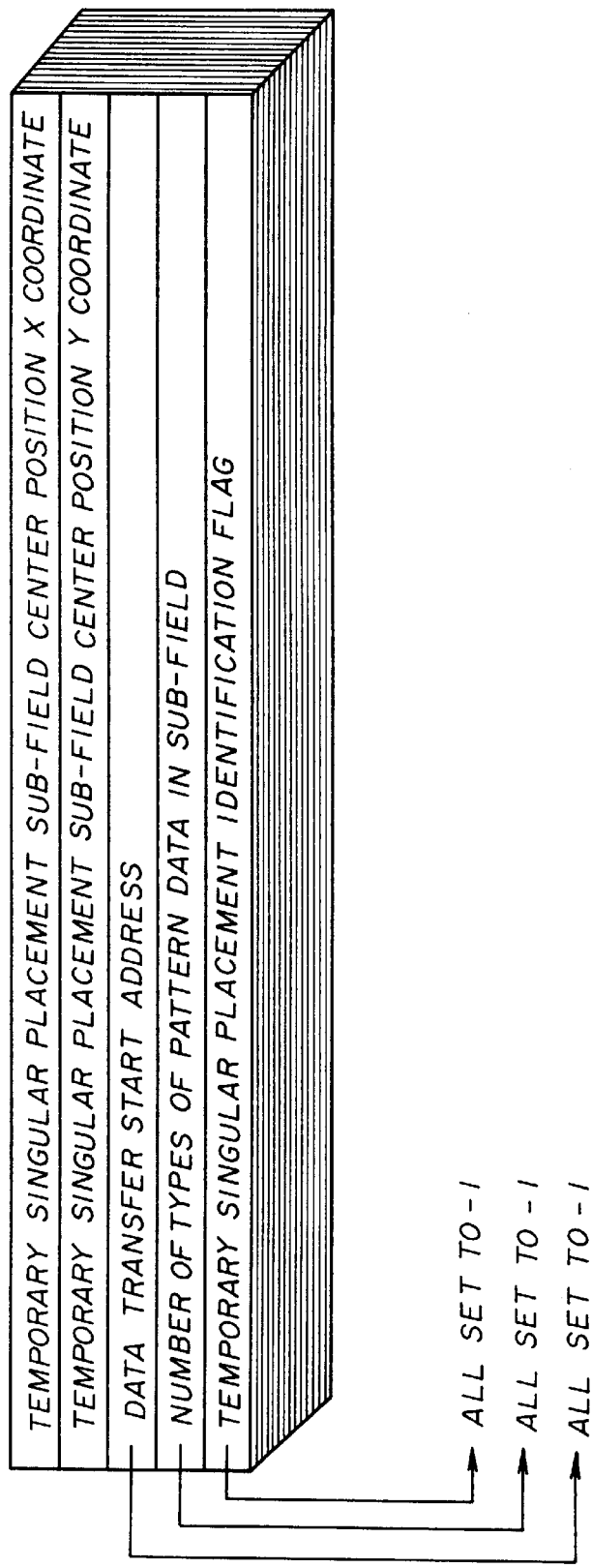
FIGS. 22A explains a content of a temporary singular placement sub-field information according to the embodiments of the present invention.
Figure 22B:
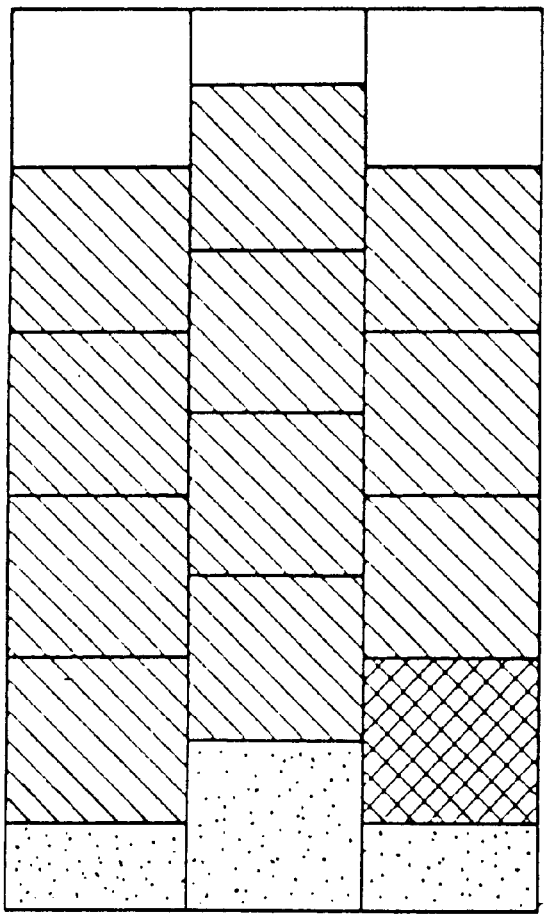
FIG. 22B explains placement of sub-fields according to the embodiments of the present invention.

In step P20, a temporary singular placement sub-field is set in the field. For example, in the case where a matrix placement sub-field and a singular placement sub-field are present in the field and where the singular placement sub-field is not found around the matrix placement sub-field, a temporary singular placement sub-field is set, as shown in FIG. 22B. Information relating to the placement of the temporary singular placement sub-field is prepared as singular placement sub-field information and has a format as shown in FIG. 22A. It will be noted that the information shown in FIG. 22A contains the temporary placement sub-field center position X and Y coordinates, the data transfer start address, the number of types of pattern data in the temporary placement sub-field, and the temporary singular placement identification flag.

The temporary singular placement sub-field information and the actual sub-field information are synthesized in step P21. In this process, the pattern data D1 is rearranged in the order subjected to correction. When the temporary singular placement sub-field center position X and Y coordinates included in the temporary singular sub-field information and the singular placement sub-field center position X and Y coordinates in the actual sub-field information coincide, the temporary singular placement sub-field information is deleted so as not to produce the supplementary exposure pattern in the temporary singular placement sub-field. If a supplementary exposure pattern is produced in the temporary singular placement sub-field, the data transfer start address, and the number of types of pattern data in the sub-field are modified. The supplementary exposure pattern is produced in step P25.

In step P22, a self-correction process of each of the exposure patterns is conducted. While the basic dosage of the electron beam is set in step P6, the process in step P22 is required in order to determine the beam dosage commensurate with each exposure pattern by reading the pattern data in each sub-field.

After the self-correction process of the exposure pattern is completed, the beam dosage for each map is revised in step P23. The beam dosage revision process is illustrated in FIGS. 24 and 25, wherein the pattern density stages as shown in FIG. 7, the exposure distance map as shown in FIG. 9A, and the beam dosage of the maps in the map admitting area determined by the CPU 13 are referred to. In this embodiment, it is assumed that the reference beam dosage is 50%.

Figure 23:
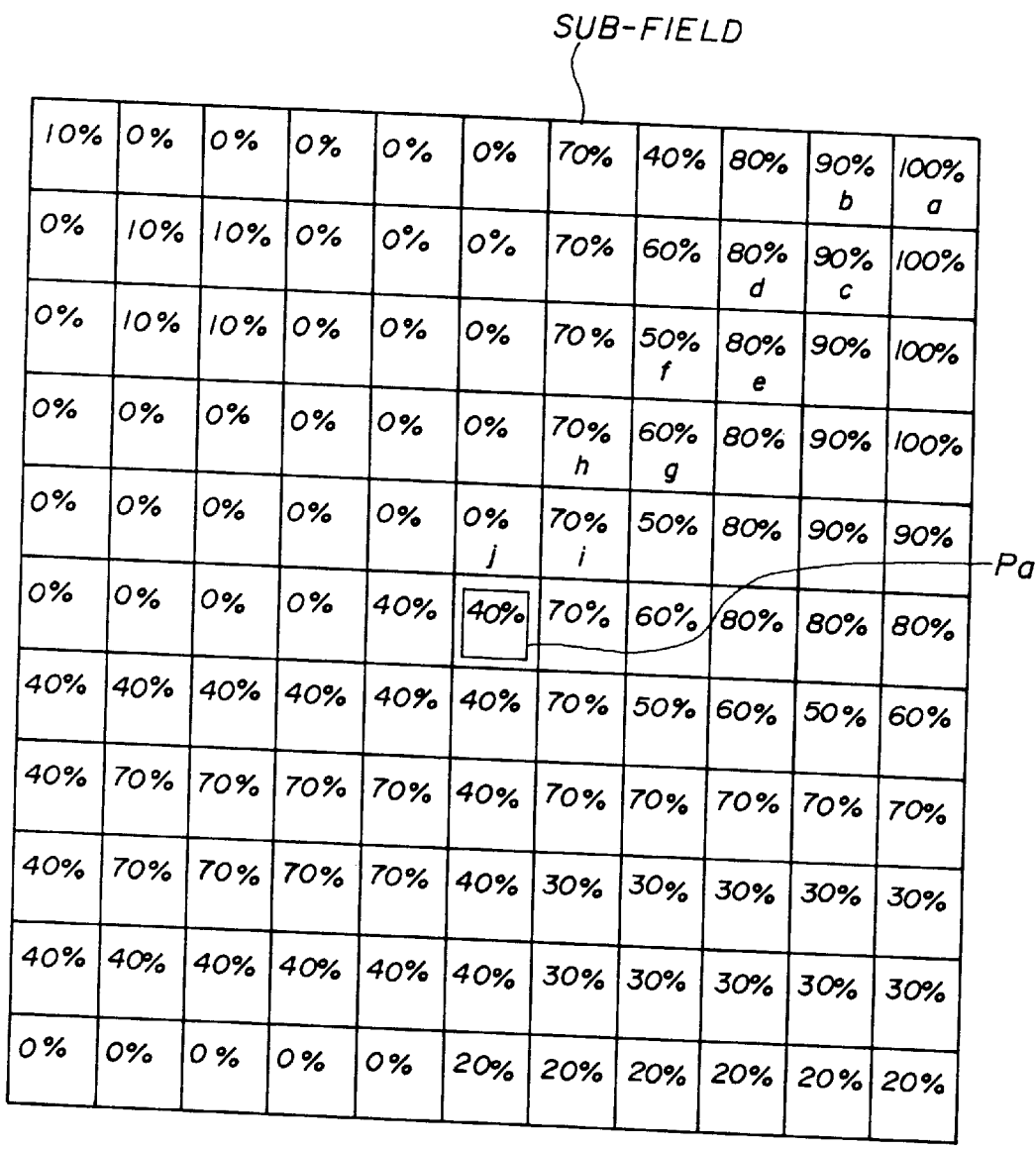
FIG. 23 explains a beam dosage revision process according to the first embodiment of the present invention (part 1)

FIG. 23 shows 121 (11×11) maps in a sub-field, each map having the size 1 $\mu$m×1 $\mu$m.

The beam dosage for the maps included in an area surrounding a correction target map p with a maximum distance of 5 $\mu$m is shown in percentage, the map p being obtained from the pattern data D1. The exposure pattern Pa has the beam dosage of 40%, and the size of the exposure pattern Pa is smaller than the size of the map.

Referring to FIG. 23, the beam dosage calibration unit 14 sets in each map (except the map p) one of the exposure distance stages 1 through 10 illustrates in FIG. 8. The exposure distance stage 10 is set in the map a, the exposure distance stage 9 is set in the map b, the exposure distance stage 8 is set in the map c, the exposure distance stage 7 is set in the map d, the exposure distance stage 6 is set in the map e, the exposure distance stage 5 is set in the map f, the exposure distance stage 4 is set in the map g, the exposure distance stage 3 is set in the map h, the exposure distance stage 2 is set in the map i, and the exposure distance stage 1 is set in the map j.

Once the exposure distance stages are set in the maps, the calibration ratio $\beta$ corresponding to the stage set is provided to each map. As a result of this, the beam dosage for the map a becomes 17% (=100×0.17). Similar processes are carried out for the other maps (except the map p). FIG. 24 shows the result of this process.

Then, the final beam dosage for the map p is determined. Assuming that the number of maps, not including the map p, in the map admitting area is a1, and the added beam dosage in the maps in the map admitting area not including the map p is b1, an average value of the beam dosage for the area outside the map p is obtained. Then, the final beam dosage for the map p is calculated as per PSf=beam dosage in the map p before the revision+an average value of the beam dosage for the maps outside the map p after revision $$= 40\% + b1/a1 = 40\% + 2165.7/120$$

$$= 58.06\%$$

Since this corresponds to the stage 7 according to the pattern density stage classification shown in FIG. 7, the correction ratio $\alpha$=0.8 is applied to the pattern data D1 so as to correct the basic dosage of the electron beam. With regard to the exposure pattern which is larger than a map, the associated description will be given in a fifth embodiment.

Next, in step P24, a determination is given as to whether or not the process of revising the beam dosage for the maps is complete. If the revision process is complete, that is, if an affirmative answer is yielded in step P24, the control is turned over to step P25. If the revision is not complete, that is, if a negative answer is yielded in step P24, the control is turned over to steps P22 and P23, whereupon the revision process is repeated by a number of times which is the same as the number of types of pattern data in the sub-field.

As shown in FIG. 22B, it is assumed that the matrix placement sub-field, the singular placement sub-field, and the temporary singular placement sub-field are placed in the field. With regard to the matrix placement sub-field, it is not necessary to expand all the layers by examining the pattern density stages based on the beam dosage set in the reference matrix placement sub-field and by providing the correction ratio $\alpha$ to the basic electron beam dosage. Therefore, revision of the beam dosage in the maps is not necessary. However, if the matrix placement sub-field is present in the neighborhood of the singular placement sub-field, it is necessary to carry out a revision of the beam dosage in the singular placement sub-field.

A determination is then made in step P25 as to whether or not the supplementary exposure pattern is to be applied in the neighborhood of the block exposure pattern. If a supplementary exposure pattern is to be applied, that is, if an affirmative answer is yielded in step P25, the control is turned over to step P26. If a supplementary exposure pattern is not to be applied, that is, a negative answer is yielded in step P26, the control is turned over to step P27.

Figure 10:
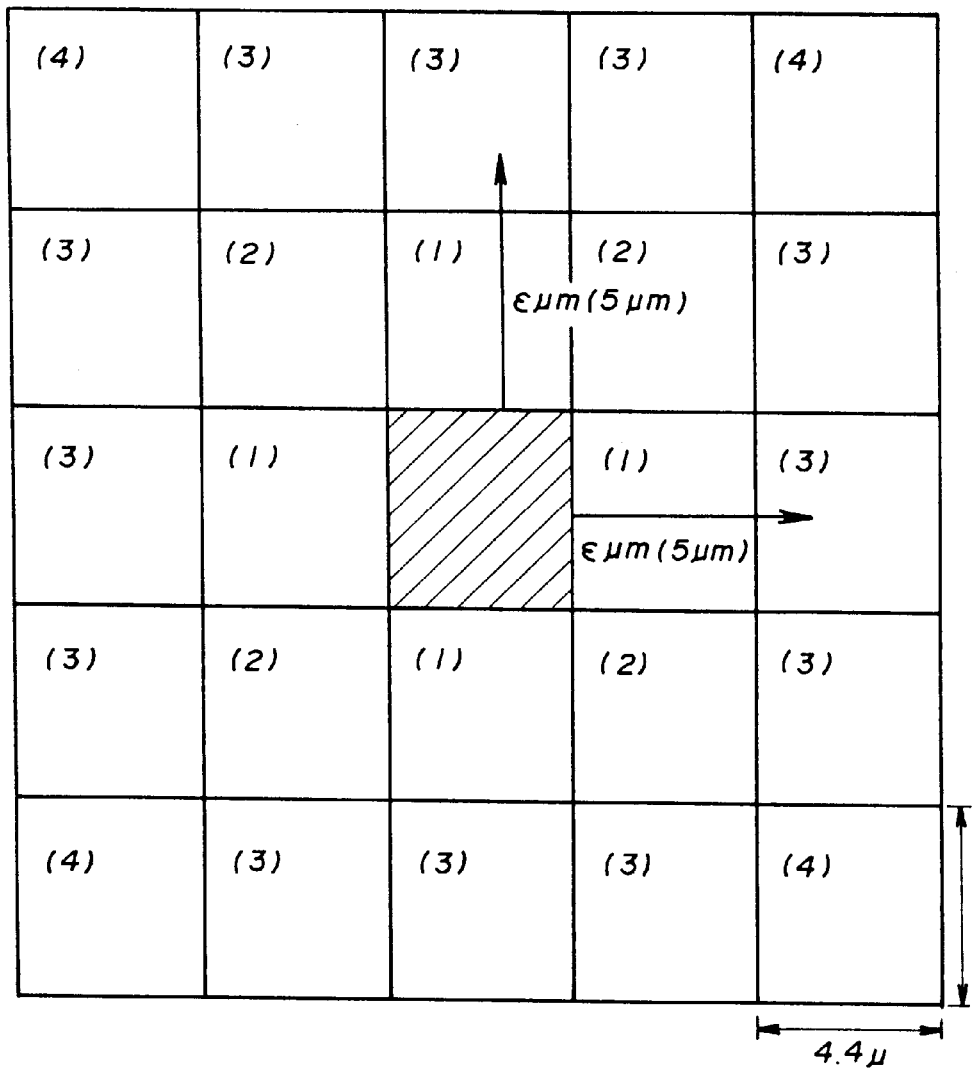
FIG. 10 explains a revision target map (4 $\mu$m×4 $\mu$m) according to the first embodiment.

In step P26, as is done in the beam dosage revision process, the exposure distance stages as illustrated in FIG. 8 and the exposure distance map as shown in FIG. 9A are referred to in the case of the 1 [$\mu$m]×1 [$\mu$m] map. In the case of the 4 [$\mu$m]×4 [$\mu$m] map, the exposure distance map is prepared based on the 1 [$\mu$m]×1 [$\mu$m] map. Thereafter, the exposure distance stages are specified as shown in FIG. 10 and the exposure distance map as shown in FIG. 9B is prepared. Using the exposure distance stages and the exposure distance map, the supplementary exposure pattern is prepared.

It is to be noted that, in this embodiment, the temporary singular placement sub-field is set in step P20 if the singular placement sub-field is not present around the matrix placement sub-field. Thus, the supplementary exposure pattern is applied to the temporary singular placement sub-field and the information relating to the temporary singular placement sub-field is added to the sub-field information and is output. The supplementary exposure pattern is used to correct the proximity effect. The size of the supplementary exposure pattern is configured to be the same as the size of the map.

The supplementary exposure pattern is used for correction that should take place between the maps. As is done in the revision process, the map data D2 included in an area surrounding the map subjected to correction and removed therefrom by a maximum distance of 5 μm is read out from the intermediate file 18. The exposure distance map is referred to so as to provide the calibration ratio β for each map. Given that the total beam dosage for the map subjected to correction and the maps surrounding it at a maximum distance of 5 μm is QQ, and that the number of maps is M, an average value QM of the beam dosage for the map subjected to correction is given by $$QM=QQ/M \, [\%]$$

The correction table shown in FIG. 7 is referred to so as to determine which stage the value of QM corresponds to. If it is found that the stage associated with the target map is one of the stages 6 through 11, no supplementary exposure pattern is prepared. If it is found that the stage associated with the target map is one of the stages 1 through 5, the supplementary exposure pattern (level 1–level 5 supplementary exposure) is prepared. The number of times that this process is repeated is the same as the number of maps in the sub-field. The supplementary exposure pattern varies the beam dosage in the map. The electron beam dosage correction ratio α is determined in accordance with the pattern density stage. For example, the correction ratio α is set to 1.0 for the pattern density stages 1 through 6; the correction ratio α is set to 0.8 for the stage 7; the correction ratio α is set to 0.6 for the stage 8; the correction ratio α is set to 0.4 for the stage 9; the correction ratio α is set to 0.2 for the stage 10; and the correction ratio α is set to 0.1 for the stage 11.

In step P27, matrix recognition process of pattern data is conducted. As a result of the beam dosage revision, the electron beam dosage may exhibit a variation over the entirety of the matrix placement pattern or the matrix placement block exposure pattern in which the same unit pattern is repeated. This is why rearrangement of matrix placement is required in step P27.

Figure 25A:
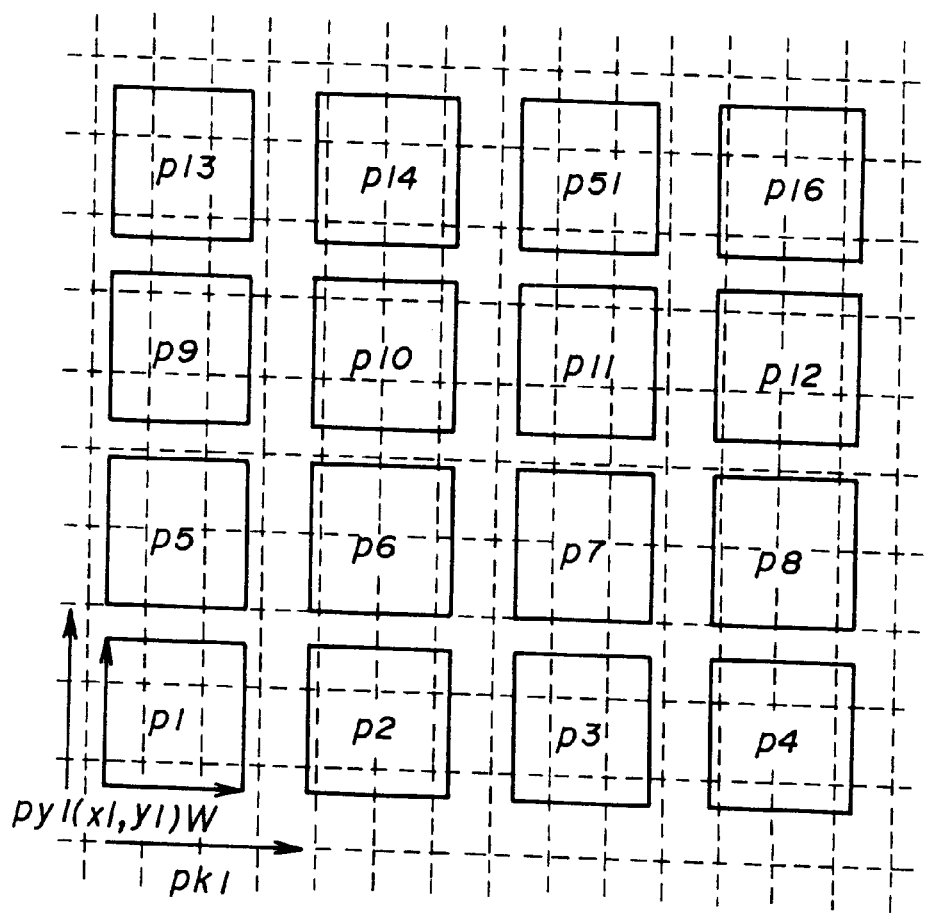
FIGS. 25A and 25B explain a process of revising a matrix placement pattern according to the embodiments of the present invention.
Figure 25B:
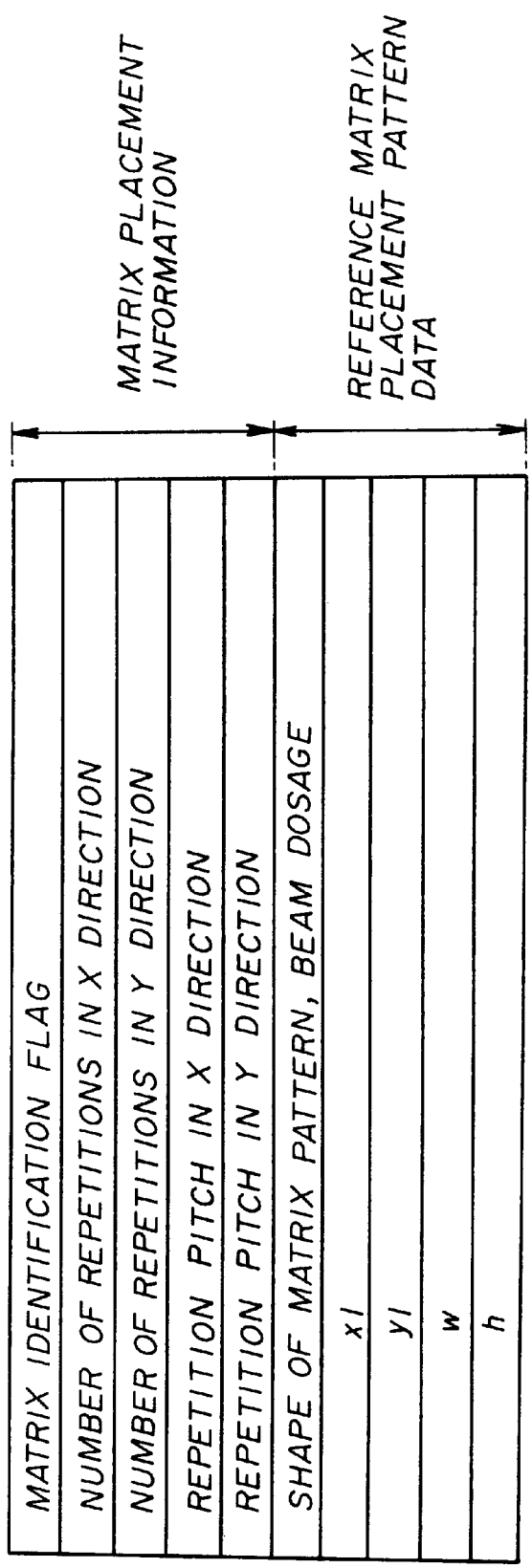

For example, given that the 4×4 matrix placement pattern as shown in FIG. 25A, rearrangement is required when the beam dosage for the four matrix placement patterns p6, p7, p10 and p11 is different from that for the surrounding twelve matrix placement patterns p1–p5, p8, p9 and p13–p16. FIG. 25B shows the matrix placement information including the matrix identification flag, the number of repetitions in the X direction=4, the number of repetitions in the Y direction=4, the repetition pitch px1 in the X direction and the repetition pitch py1 in the Y direction. FIG. 25B also shows the reference matrix placement pattern p1 information including the shape of the pattern, the dosage, the starting position coordinates x1 and y1, the height h of the pattern, and the width w of the pattern.

The 4×4 matrix placement shown in FIG. 25A may be rearranged into the matrix placement wherein three matrix placement patterns p1, p5 and p6 are used as the reference. The reference matrix placement pattern p1 is such that the number of repetitions is equal to 4, the number of repetitions is equal to 2, the repetition pitch in the X direction is px1, and the repetition pitch in the Y direction is a length obtained by subtracting the starting point y coordinate y of the pattern 1 from the starting point coordinate y of the pattern p13. The matrix placement patterns having the same pattern data as the reference matrix placement pattern p1 are the seven patterns p2–p4 and p13–p16.

The reference matrix placement pattern p5 is such that the number of repetitions in the X direction is 2, the number of repetitions in the Y direction is 2, the repetition pitch in the X direction is a length obtained by subtracting the starting point x coordinate of the pattern p5 from the starting point x coordinate of the pattern p8, and the repetition pitch in the y direction is a length obtained by subtracting the starting point y coordinate of the pattern p5 from the starting point y coordinate of the pattern p9. The matrix placement patterns having the same pattern data as the reference matrix placement pattern p5 are the three patterns p8, p9 and p12.

The reference matrix placement pattern p6 is such that the number of repetitions in the X direction is 2, the number of repetitions in the Y direction is 2, the repetition pitch in the X direction is a length obtained by subtracting the starting point x coordinate of the pattern p6 from the starting point x coordinate of the pattern p7, and the repetition pitch in the Y direction is a length obtained by subtracting the starting point y coordinate of the pattern p6 from the starting point y coordinate of the pattern p10. The matrix placement patterns having the same pattern data as the reference matrix placement pattern p6 are the three patterns p7, p10 and p11. The pattern data D1 is processed using the intermediate file 18.

Matrix recognition process using the supplementary exposure pattern may also be conducted in the case where the supplementary exposure pattern is provided in the singular placement sub-field, or in the case where the supplementary exposure pattern is provided in the temporary singular placement sub-field.

Next, in step P28, the pattern data D1 in the sub-fields is output to the data conversion editor 21. In step P29, a determination is made as to whether or not the output of the pattern data D1 is complete. If the output of the pattern data D1 is complete, that is, if an affirmative answer is yielded in step P29, the control is turned over to step P30. If the output of the pattern data D1 is not complete, that is, if a negative answer is yielded in the step P29, the control is returned to step P19, whereupon steps P19 through P28 are repeated.

When the output of the pattern data D1 in the sub-field is complete, the pattern data in the field is output to the data conversion editor 21 in step P30. In this process, the pattern data D1 is converted into a data format adapted for the exposure apparatus and stored in the output file 22. If, in step P26, the supplementary exposure pattern is provided in the temporary singular placement matrix sub-field prepared in step P20, the order of exposure is rearranged on the basis of the temporary singular placement sub-field information added to the sub-field information. The pattern data D1 is converted accordingly.

In step P31, a determination is made as to whether or not the pattern data conversion is completed for all the fields. If the pattern data conversion is completed for all the fields, that is, if an affirmative answer is yielded in step P31, the control is turned over to step P32. If the pattern data conversion is not completed for all the fields, that is, a negative answer is yielded in step P31, the control is returned to step P16, whereupon steps P16 through P30 are repeated.

When the conversion process is completed for all the fields, information in the processed layers of the target LSI designed is converted to the format adapted for the exposure apparatus in step P32. Information relating to the processed layers is rewritten as required so that the exposure data DOUT is output to the output file 22.

Thereupon, a determination is made as to whether or not all the layers to be processed have been processed in step P33. When all the layers have been processed, that is, if an affirmative answer is yielded in step P33, the data process is ended. If all the layers have not been processed, that is, if a negative answer is yielded in step P33, the control is returned to step P2, whereupon steps P2 through P32 are repeated. This way, exposure data is prepared for the case where block exposure data is present in the design data DIN and the matrix placement sub-field is present in the target field subjected to correction.

As has been described, according to the exposure data preparing apparatus of the present invention, an exposure pattern adapted for design data is placed by the field placement editor 11 in the sub-field obtained by segmenting the target field subjected to correction, each sub-field having a size that can be covered by a deflection of an electron beam. The map preparing editor 11 segments the sub-field into areas that can be exposed by a shot of an electron beam emitted by the exposure apparatus. A plurality of maps are disposed in the sub-field, in which an exposure pattern is placed. Further, beam dosages in the exposure patterns placed by the field placement editor 11 and occupying the maps in the sub-fields are obtained, map for map, by the CPU 13. The CPU 13 applies an electron beam dosed in accordance with the beam dosages in each of the exposure patterns.

Since the beam dosages for the exposure patterns that occupy the maps in the sub-field are determined map for map, each map having a size that can be covered by a shot of electron beam, all the exposure patterns placed in the sub-field are exposed to an appropriately dosed electron beam with each shot.

In further accordance with the first embodiment described above, once the electron beam dosage that depend on the size of the exposure pattern are determined, the CPU 13 computes the correction ratio α for the electron beam dosage. This calculation is based on map-for-map calculation of the spatial ratio that exists between the size of the map and the size of the exposure pattern that occupies the map. Thus, the electron beam dosage most appropriate for the spatial ratio is determined for each exposure pattern.

In still further accordance with the first embodiment, it is easy to determine the beam dosage for each map through step P10 (see FIG. 14). The beam dosage in the map subjected to correction is easily determined through step P15. Further, it is easy to determine the beam dosage in the map subjected to correction through step P15. One of the maps is set to have the reference beam dosage that serves as a reference for the other maps. The electron beam dosage remains uncorrected for the map that has a beam dosage higher than the reference beam dosage. With regard to the map that has a beam dosage lower than the reference beam dosage, a supplementary exposure pattern having a size equal to the map is applied adjacent to the map. By modifying the beam dosage in the map using the supplementary exposure pattern, the correction ratio α for the electron beam dosage can easily be set. Thus, the proximity effect can be corrected by modifying an electron beam shot dosage.

In yet further accordance with the first embodiment, the CPU 13 sets the correction ratio a high when the exposure pattern density in the map is high. Conversely, when the exposure pattern density is low, the CPU 13 sets the correction ratio α low. It is therefore possible to set the electron beam dosage low when the exposure pattern density in a given map is high, and to set the electron beam dosage high when the exposure pattern density in a given map is low. Thus, the proximity effect can be corrected by modifying an electron beam dosage in relationship to the exposure pattern density.

In still further accordance with the first embodiment, the beam dosage calibration unit 14 integrates the beam dosage of the maps surrounding, with a maximum distance of 5 μm, the map that is a target for correction, the integration being done along the paths between the target map and the surrounding map. In this way, the calibration ratio β for modifying the beam dosage in the surrounding maps is calculated. Adjustment of beam dosage can thus take place between the target map and the surrounding maps, using the calibration ratio β. Using the electron beam position, it is possible to correct the proximity effect that occurs between the exposure patterns without causing a disorder in the layers of the target LSI designed.

In still further accordance with the first embodiment, the calibration ratio β for the 1 [μm]×1 [μm] map is obtained. Thereafter, the calibration ratio for the map having an arbitrary size is computed by conversion. As has been described, it is easy to conduct a revision in the beam dosage of the exposure pattern that occupies the 4.4 [μm]×4.4 [μm] map.

In further accordance with the first embodiment, since the supplementary exposure pattern preparing unit 15 is provided, it is possible to prepare a correction exposure pattern having the same size as the maps in the singular placement sub-field, when the supplementary exposure pattern is applied in the neighborhood of the matrix placement sub-field obtained by segmenting the target field to be exposed, and when the singular placement sub-field is present in the neighborhood of the matrix placement sub-field. If the temporary singular placement sub-field is present in the neighborhood of the matrix placement sub-field, it is possible to prepare a supplementary exposure pattern having the same size as the maps in the singular placement sub-field. Therefore, it is possible to correct the proximity effect commensurate with the density of the exposure pattern that occupies the maps in the matrix placement sub-field.

A description will now be given of a second embodiment of the present invention.

FIG. 27 shows a content of the correction table memory in order to illustrate the function of the CPU according to the second embodiment. The second embodiment differs from the first embodiment in that the CPU determines the correction ratio α for the electron beam dosage in accordance with the pattern density stages, a reference beam dosage being set in correspondence to the pattern density of 30%.

Referring to FIG. 27 the density of the pattern that occupies the map is classified into eleven stages, as is done in the case of the first embodiment. The correction ratio α for the electron beam dosage, and the requirement for the supplementary exposure pattern are listed in relationship to the stages, the reference beam dosage being set in correspondence to the pattern density of 30%. It is to be noted that $0.1 \leq \alpha \leq 1.0$. In the example shown in FIG. 27, it is assumed that a level 3 supplementary exposure pattern is required when the exposure pattern density is in the 0.0–7.5% range. A level 4 supplementary exposure pattern is required when the exposure pattern density is in the 7.5–16.5% range. A level 5 supplementary exposure pattern is required when the exposure pattern density is in the 16.5–25.5% range. The correction ratio β of 1.0 is set for the case where the exposure pattern density is low (stages 1–3). When the exposure pattern density is high (stages 4–11), it is assumed that no supplementary exposure is required. The correction ratio α is set to 0.8 for the stage 4, 0.6 for the stage 5, 0.4 for the stage 6, 0.2 for the stage 7, and 0.1 for the stages 8–11.

The CPU 13 sets the electron beam dosage correction ratio α low, when the density of the exposure pattern that occupies the map is high. When the exposure pattern density is low, the CPU 13 sets the correction ratio α high.

By varying the reference beam dosage, it is possible to modify a supplementary exposure pattern prepared and to modify the correction ratio α for the electron beam dosage. In this way, it is possible to prepare exposure data adapted for the circuit scale of the target LSI designed.

A description will now be given of a third embodiment of the present invention.

Figure 28:
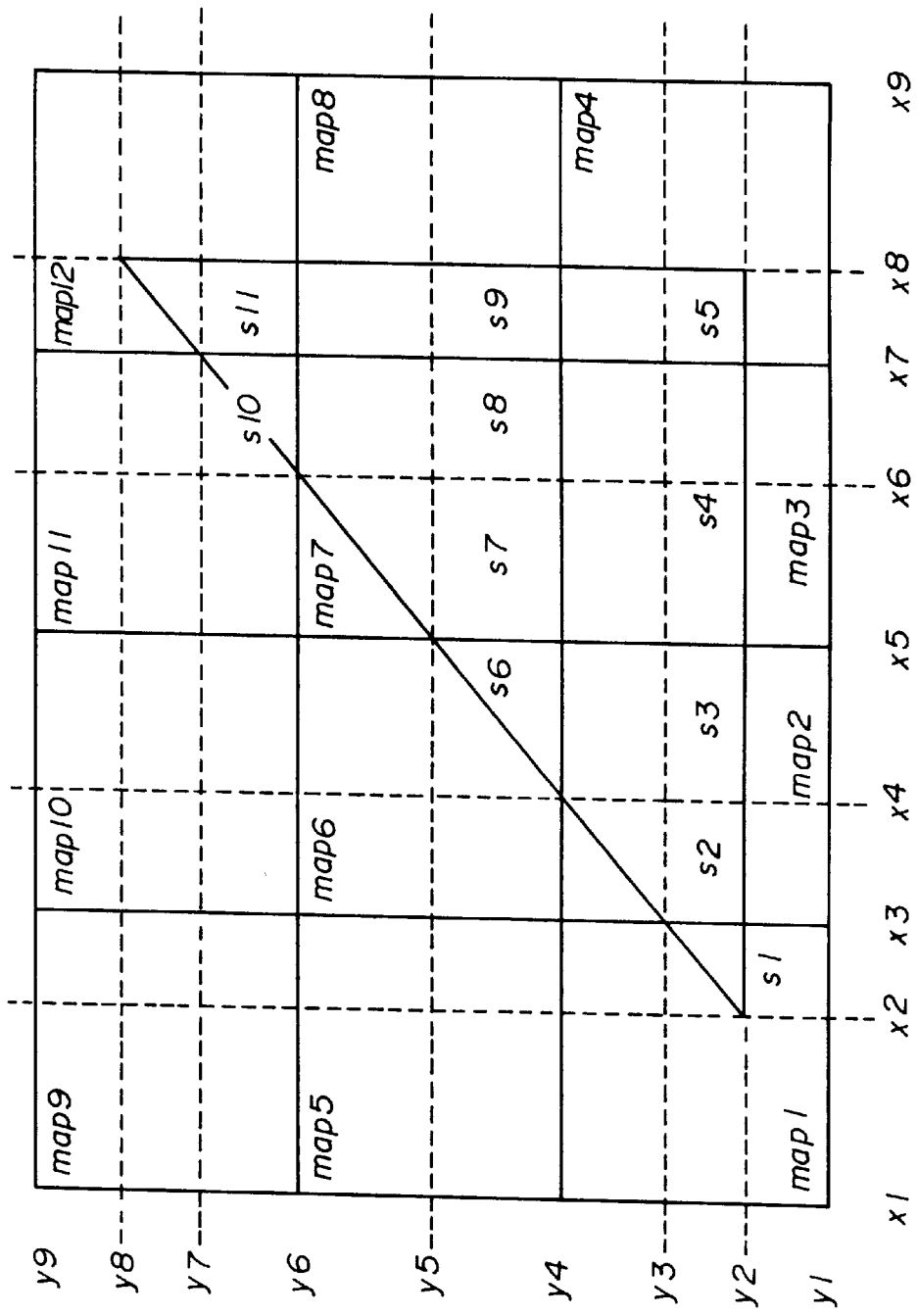
FIG. 28 explains how a beam dosage in a non-rectangular pattern is calculated according to a third embodiment of the present invention.

FIG. 28 explains how the exposure pattern for a non-rectangular pattern is calculated. The third embodiment differs from the first embodiment in that the non-rectangular pattern that covers a plurality of maps is obtained. The correction ratio a for the electron beam dosage is determined by the CPU 13 in accordance with the beam dosage and the pattern density stages.

For example, it is assumed that the beam dosage in a triangular exposure pattern as shown in FIG. 28 is to be determined. The triangle exposure pattern involves nine maps (map 1–map 4, map 6–map 7, map 11 and map 12). All intersections of the map edges and the exposure patterns are listed. There are a total of seven intersections having coordinates (x2,y2), (x3, y3), (x4, y4), (x5, y5), (x6, y6), (x7, y7) and (x8, y8). The equation for the line passing through the coordinates (x2, y2) and (x8, y8) is determined. Assuming that the equation is F1(Y)=MX+P, M is equal to (y8−y2)/(x8−x2), and P is equal to (y2·x8−x2·y8)/(x8−x2).

The equation for the line passing through the intersections (x2, y2) and (x8, y2) is determined. Assuming that the equation determined is F2(Y)=Q, the beam dosage s1 in the map 1 is given by $$S1 = \int_{x2}^{x3} F1(Y)dx - \int_{x2}^{x3} F2(Y)dx$$

The equation for the line passing through the intersections (x3, y2) and (x8, y2) is determined. Assuming that the equation determined is F3(Y)=Q, the beam dosage s2 in the map 2 is given by $$S2 = \int_{x3}^{x4} F1(Y)dx - \int_{x3}^{x4} F3(Y)dx$$

The equation (F4(Y)=R) for the line passing through the intersections (x4, y4) and (x8, y4) is determined. The equation (F5(Y)=Q) for the line passing through the intersections (x4, y2) and (x8, y2) is determined. The beam dosage s3 in the map 2is given by $$S3 = \int_{x4}^{x5} F4(Y)dx - \int_{x4}^{x5} F5(Y)dx$$

The beam dosage s6 in the map 6 is given by $$S4 = \int_{x4}^{x5} F1(Y)dx - \int_{x4}^{x5} F4(Y)dx$$

The beam dosage in the other maps can be determined in a similar manner.

As a result, the beam dosage in the map 1 is given as s1, the beam dosage in the map 2 is given as s2+s3, the beam dosage in the map 3 is given as s4, the beam dosage in the map 4 is given as s5, the beam dosage in the map 6 is given as s6, the beam dosage in the map 7 is given as s7+s8, the beam dosage in the map 8 is given as s9, the beam dosage in the map 11 is given as s10, and the beam dosage in the map 12 is given as s11.

As has been described, according to the third embodiment, the beam dosages in the triangular exposure pattern that covers the nine maps (map 1–map 4, map 6–map 9, map 11 and map 12) are obtained. Therefore, by setting the electron beam dosage in relationship to the size of the exposure pattern, the CPU 13 is able to set the correction ratio α for the electron beam dosage so that an appropriate electron beam dosage commensurate with the beam dosage in the triangular exposure pattern.

Figure 29:
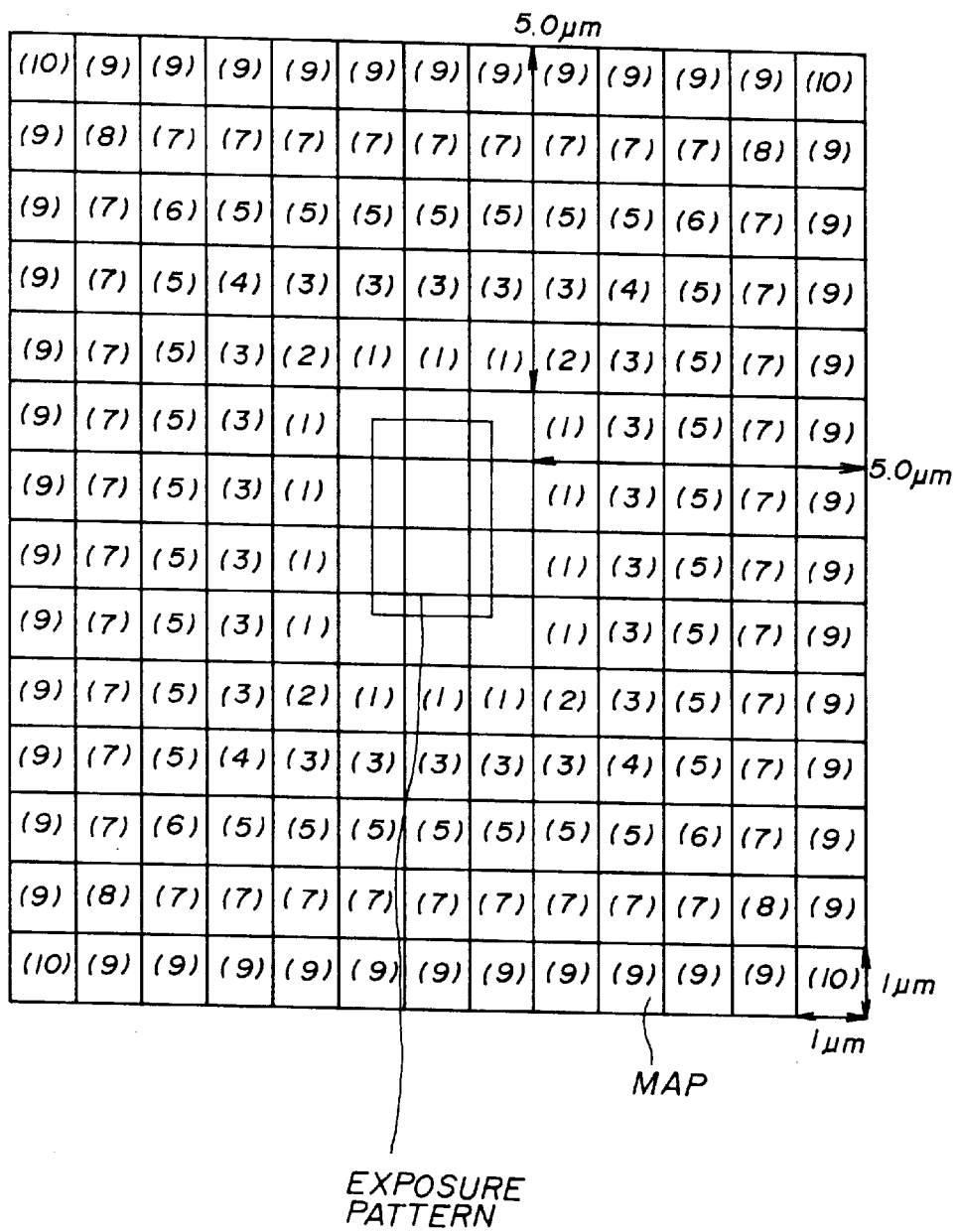
FIG. 29 explains a process of revising a beam dosage in a pattern that extends between maps according to a fourth embodiments of the present invention (part 1)
Figure 30:
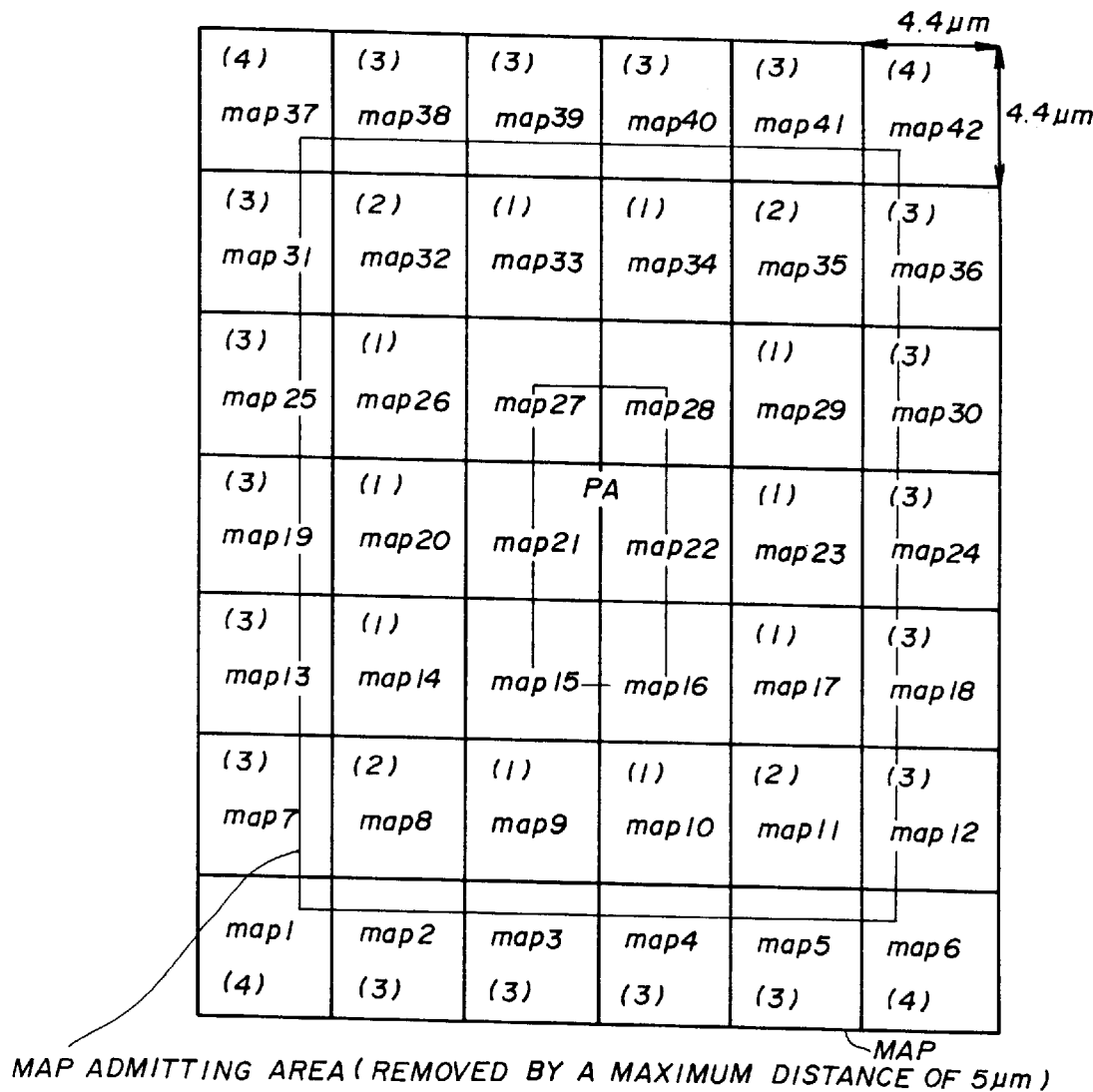
FIG. 30 explains a process of revising a beam dosage in a pattern that extends between maps according to the fourth embodiment of the present invention (part 2)

FIGS. 29 and 30 explain how the beam dosage in the pattern that covers a plurality of maps is revised according to a fourth embodiment. The fourth embodiment differs from the first embodiment in that the beam dosage of the exposure pattern that covers twelve maps as shown in FIG. 29 is determined by adding the average beam dosage of 170 maps surrounding the target pattern and removed therefrom by a maximum distance of 5 μm to an average beam dosage in the target exposure pattern which covers the twelve maps.

FIG. 29 shows an exposure pattern that occupies twelve maps being placed in an area consisting of the 182 (13×14) 1 [μm]×1 [μm] maps. The number of maps included in the pattern data is 12, and the number of other maps is 170. Assuming that the total beam dosage in the maps included in the pattern data is QA and that the total beam dosage in the maps obtained as a result of revision using the pattern density stages found in the exposure distance map is Qf, $$Qf\ (96)=[QA/12]+[QB/170]$$

As is done in the first embodiment, the correction ratio α for the electron beam dosage is determined in relationship to the pattern density stages.

FIG. 30 illustrates a revision of a beam dosage of the exposure pattern PA in the singular placement sub-field placed in the 42 (6×7) 4.4 [μm]×4.4 [μm]maps (map 1–map 42), map 15, map 16, map 21, map 22, map 27 and map 28 that include the pattern PA are selected. All the maps included in the 5 μm map admitting area are determined.

As has been described in the first embodiment, given the beam dosages Q1 through Q42 for the map 1 through map 42, respectively, the results obtained by multiplying the beam dosage by the calibration ratio β will be denoted by QQ1 through QQ42, respectively. It will be noted that the beam dosages QQ15, QQ16, QQ21, QQ22, QQ27 and QQ28 remain unchanged after the multiplication. The number of maps not including any portion of the exposure map is 36, and the number of maps including a portion of the exposure pattern PA is 6.

The beam dosage PQA for the exposure pattern PA is determined as follows. Assuming that an average beam dosage in the maps including a portion of the exposure pattern PA is denoted by PQQ $$PQQ=(QQ15+QQ16+QQ21+QQ22+QQ27+QQ28)/6$$

Assuming that an average beam dosage of the maps not including any portion of the exposure pattern PA is PQQ1, $$PQQL=(QQ1+\cdots+QQ14+QQ17+\cdots QQ20+QQ23+\cdots+QQ26+QQ29+\cdots+QQ42)/36$$

The beam dosage PQA is obtained based on PQQ and PQQ1 as per $$PQA[\%]=PQQ+PQQ1$$

The beam dosage PQA is designated as a final beam dosage in the exposure pattern PA. A determination is then made as to which pattern density stage the value of PQA belongs to. For example, if the value of PQA in the exposure pattern PA corresponds to one of the stages 1 through 6 of the pattern density listed in the correction table of FIG. 7, the correction ratio α of 1.0 is applied to the electron beam dosage. If PQA corresponds to stage 7, the correction ratio of 0.8 is applied in revising the beam dosage. It is possible to apply the correction ratio α when the supplementary exposure pattern is prepared (a third preparing method).

A description will now be given of a fifth embodiment of the present invention.

Figure 31:
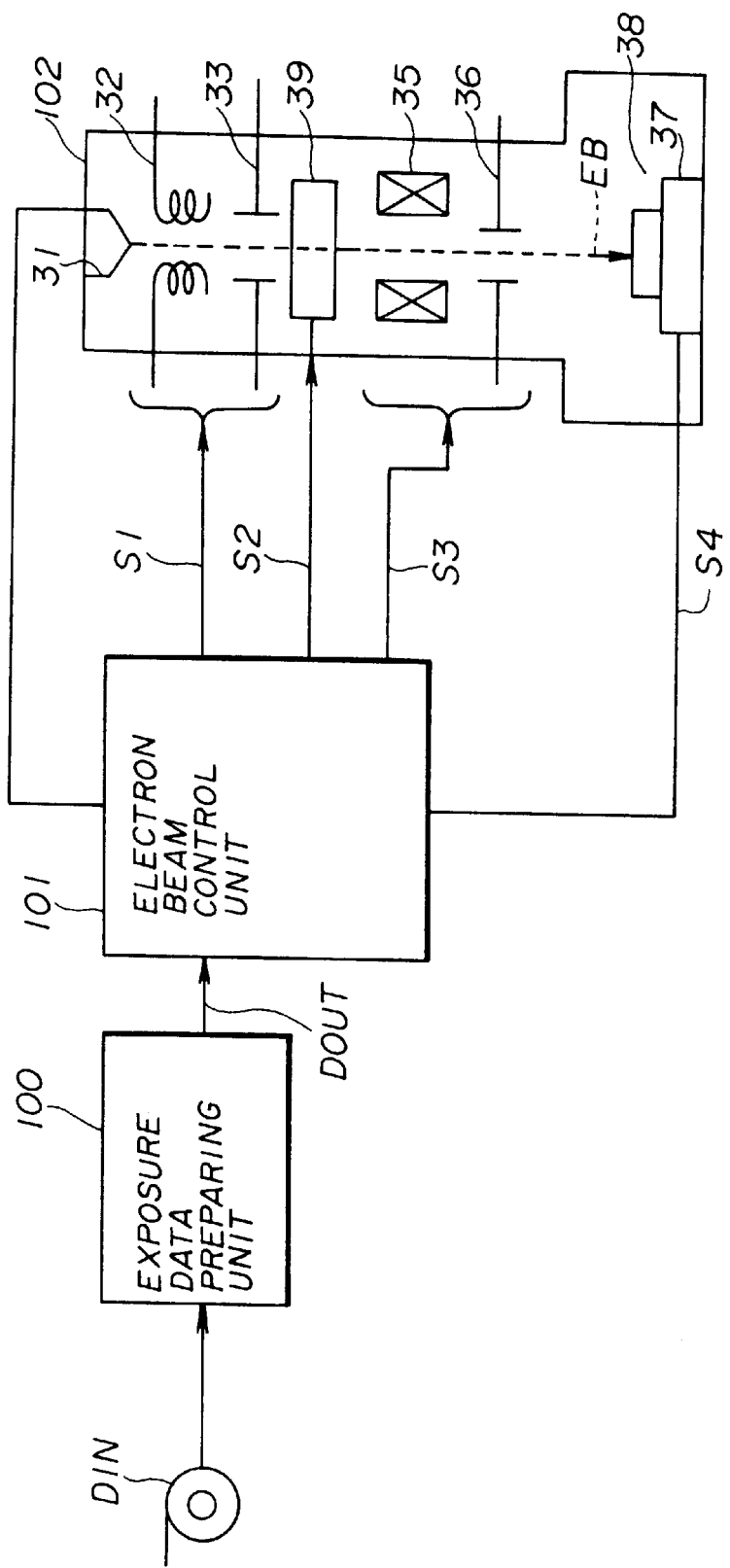
FIG. 31 shows a construction of an electron beam exposure apparatus according to a fifth embodiment of the present invention.

FIG. 31 shows the construction of a charged particle beam exposure apparatus according to the fifth embodiment of the present invention. Specifically, FIG. 31 shows an electron beam exposure apparatus having a block exposure function. Referring to FIG. 31, there is provided an exposure data preparing unit 100 which embodies data preparing means as claimed for preparing exposure data DOUT based on design data DIN for a target area to be exposed.

An electron beam control unit 101 which embodies a control unit as claimed outputs control signals S1–S4 to a beam deflecting system in accordance with the exposure data DOUT supplied by the exposure data preparing unit 100. S1 denotes a signal for defining a position of an electron beam EB, S2 denotes a signal for selection of a mask which is applied the electron beam EB, S3 denotes a signal for deflecting the electron beam EB, and S4 denotes a signal for translating a stage.

An electron beam unit 102 which embodies deflecting means is responsible for deflection of the electron beam EB, translation of the stage and the like, in accordance with the control signals S1–S4 supplied by the control unit 101. In the fifth embodiment, mask means for exposing a block pattern is provided in the electron beam unit 102. Preferably, a stencil mask 34 is used as the mask means. The stencil mask 34 is provided with block pattern openings that can be covered by a single shot of the electron beam. The electron beam exposure apparatus as shown in FIG. 31 also has an electron gun 31 for supplying the electron beam EB, an alignment coil 32 for aligning the electron beam EB, and an aperture 33 for shaping the electron beam to have a rectangular shape, a main deflector 35 for deflecting the electron beam EB electrostatically, a sub-deflector 36 for deflecting the electron beam EB electrostatically, and a stage 37 for translating an exposure target 38 in the X and Y directions.

A description will now be given of the operation of the electron beam exposure apparatus according to the present invention. The exposure data preparing unit 100 prepares the exposure data DOUT based on the design data DIN of the exposure target 38. The control signals S1–S4 for controlling the beam deflecting system according to the data DOUT are output from the control unit 101 to the electron beam unit 102. The electron beam EB is projected after deflection onto sub-fields obtained by segmenting the exposed area on the exposure target 38, with a most appropriate dosage defined by the control signals S1–S4 output from the control unit 101. Thus, desired patterns are created on the exposure target 38 by a lithographic process. The stencil mask 34 of the electron beam unit 102 causes the block patterns to be exposed.

The control signals S1–S4 supplied by the control unit 101 in accordance with the exposure data DOUT control the aperture 33, the stencil mask 34, the main deflector 35, the sub-deflector 36 and the stage 37 provided in the electron beam unit 102. The sub-fields of the exposure target 38 are exposed to a most appropriate dosage of the electron beam EB with each shot.

In this way, it is possible to create uniform patterns on the exposure target 38 regardless of the pattern density. However high the semiconductor circuit integration is, it is possible to produce a high-resolution LSI pattern mask.

A description will now be given of a sixth embodiment of the present invention. The sixth embodiment is intended to improve the stitching accuracy of the pattern on field boundaries. In order to achieve this goal, the process of preparing exposure data is improved.

Figure 32A:
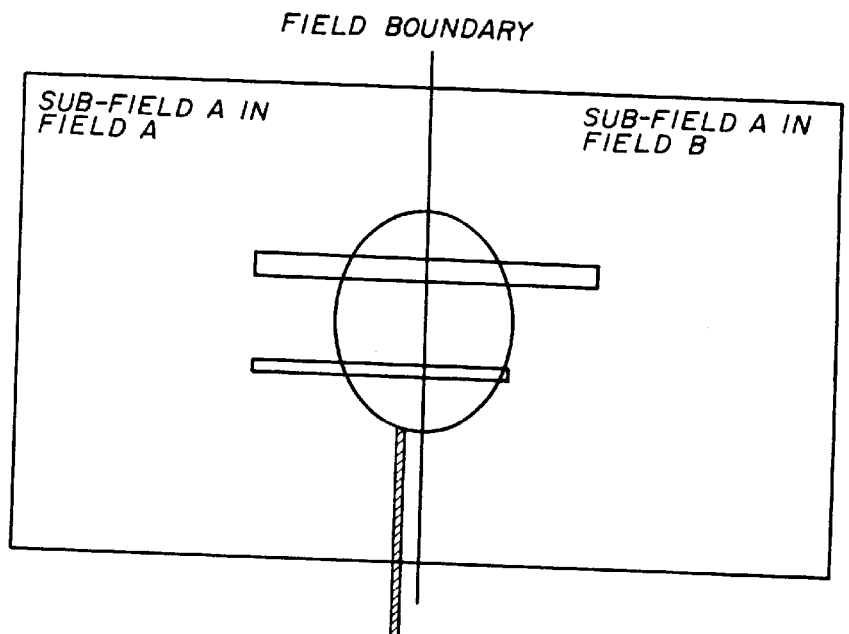
FIGS. 32A and 32B show a problem that a sixth embodiment of the present invention is designed to solve.

FIG. 32A illustrates a conceivable problem that occurs at a boundary of fields. A step may be produced in a pattern that extends between the sub-fields A and B. The step is mainly caused by an error in the translation of the stage of the electron beam exposure apparatus. It is actually impossible to eliminate such an error. The sixth embodiment is based on an assumption that the error is inevitable and prevents discontinuity in the wiring from occurring as a result of a step, by allowing the wiring to descend (ascend) the step in a gradual manner, as indicated by broken lines in FIG. 32B. Thus, the stitching accuracy of the pattern on field boundaries can be apparently improved.

Figure 32B:
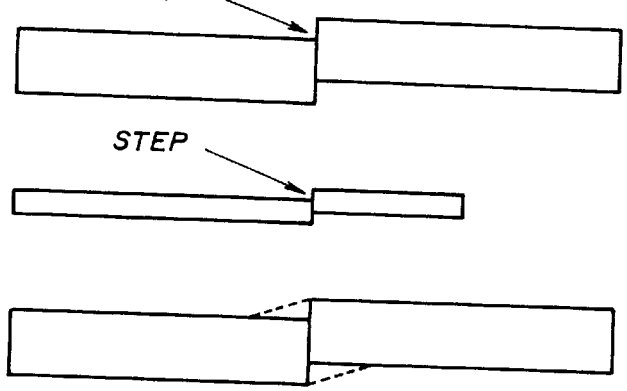
Figure 33:
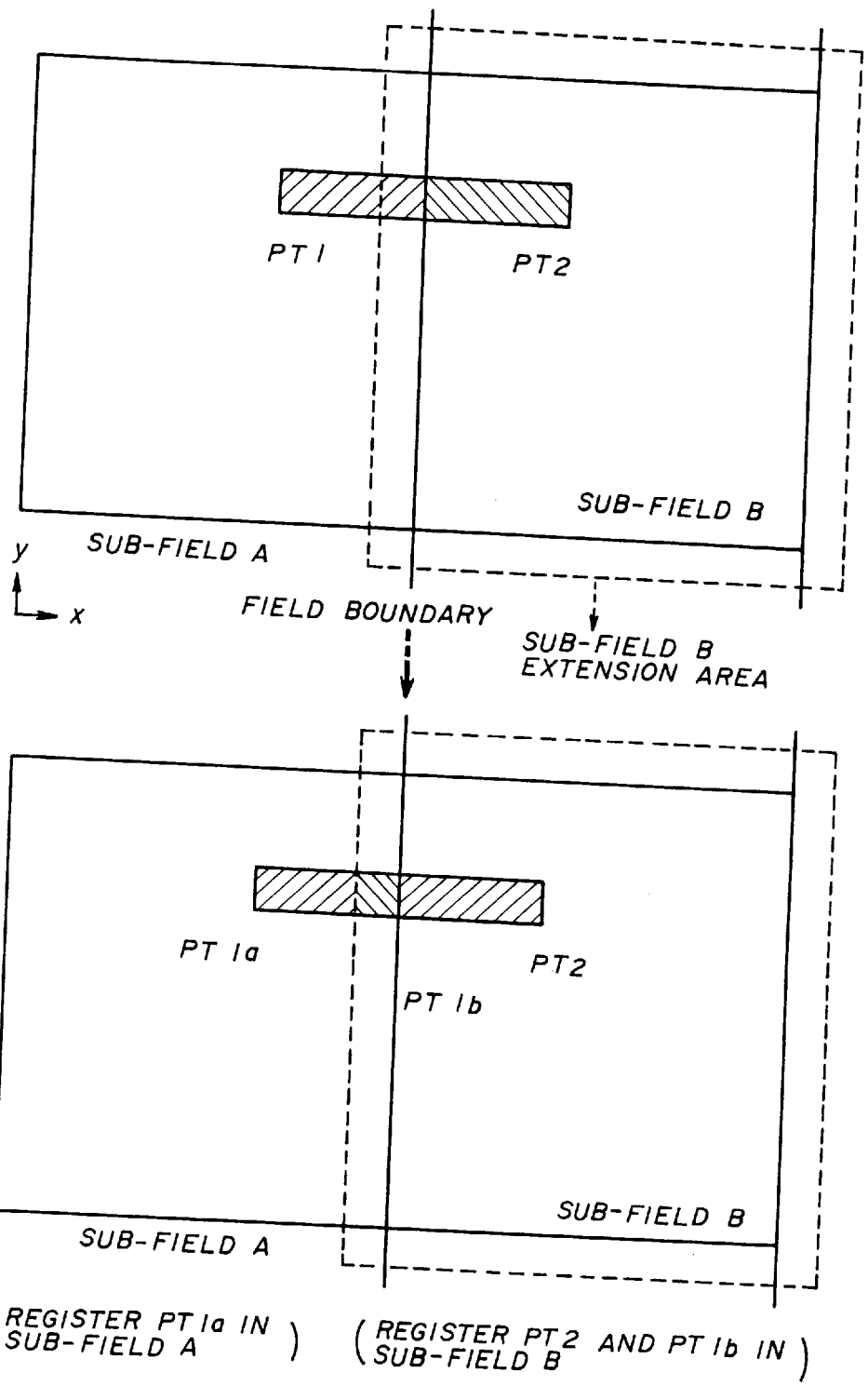
FIG. 33 explains a process according to the sixth embodiment of the present invention.
Figure 34:
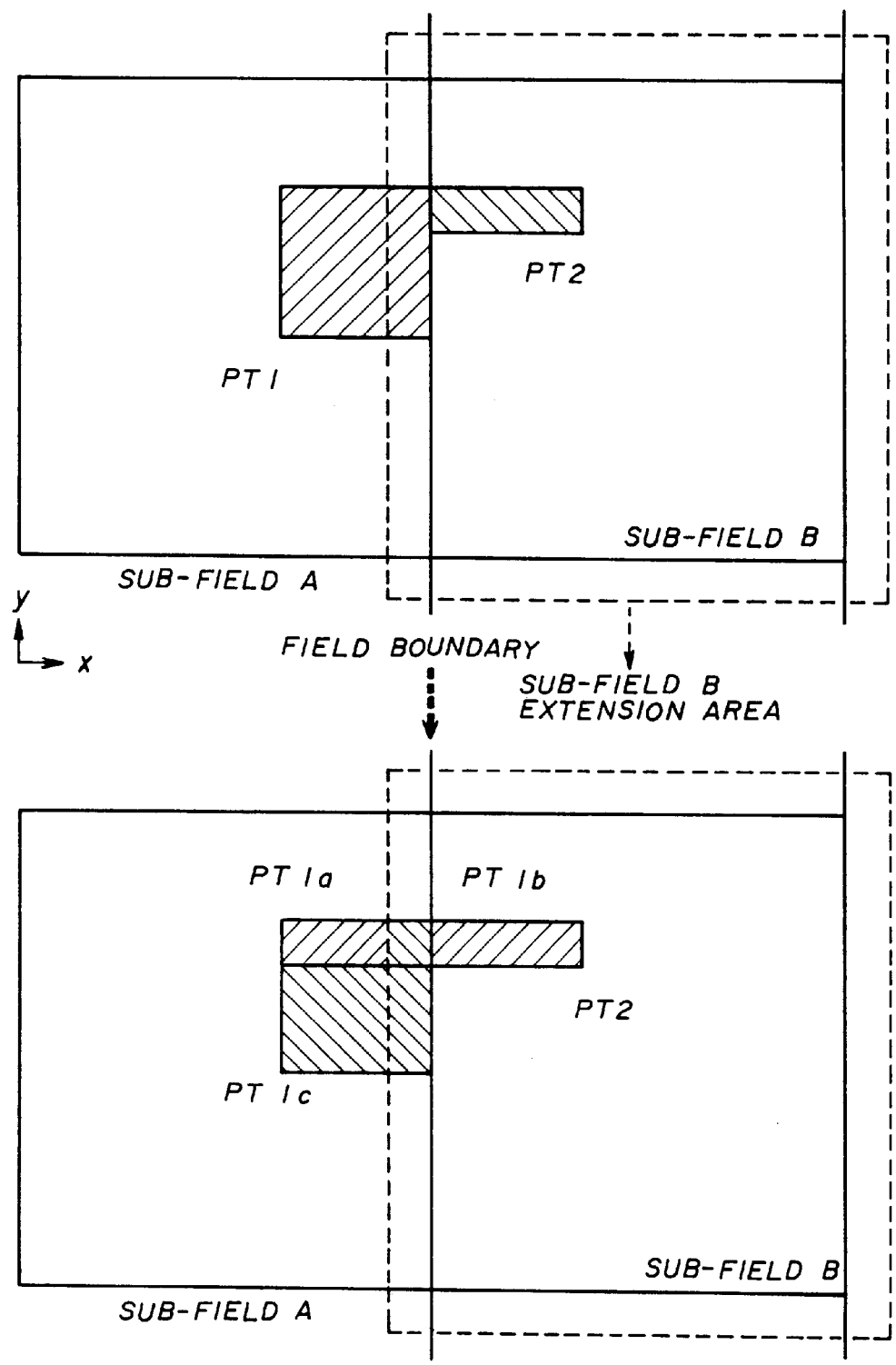
FIG. 34 explains a process according to the sixth embodiment of the present invention.

In order to achieve the connection between patterns as shown in FIG. 32B, the sixth embodiment ensure that a process illustrated in FIGS. 33 and 34 take place. FIGS. 33 and 34 concerns a case of a variable rectangular pattern. A separate description will be given later of a block pattern.

Referring to FIG. 33, there is a pattern that extends between the sub-fields A and B on a boundary of fields. The sub-field A has a pattern PT1 and the sub-field B has a pattern PT2. In other words, the pattern PT1 registered in the sub-field is adjacent to the pattern PT2 registered in the sub-field B. Broken lines in FIG. 33 indicates an area (referred to as an extension area) in which an exposure in the sub-field B takes effect. It is to be noted that the sub-field B extension area extends across the boundary between the sub-fields A and B. For example, the sub-field B extension area extends beyond the boundary of the sub-field B by 4 $\mu$m in the X and Y directions. The pattern PT1 in the sub-field A is divided into the patterns PT1a and PT1b. The pattern PT1B is registered as an exposure pattern in the sub-field B. Therefore, when the sub-field B is exposed, the pattern PT1b is exposed as well. Since the pattern PT1b is also registered as an exposure pattern in the sub-field A, the pattern PT1b is exposed both when the sub-field A is exposed and when the sub-field B is exposed. That is, a double-exposure takes place in the boundary area between the sub-fields A and B. Likewise, a portion of the pattern PT2 in the sub-field B is registered as a pattern in the sub-field A. The registered portion is exposed when the sub-field A is exposed. By exposing the same pattern twice, the gradual connection as indicated by the broken lines in FIG. 32B is achieved.

In a case shown in FIG. 34, the pattern PT1 is divided into three patterns PT1*a*, PT1*b* and PT1*c*. The pattern PT1*b* is registered in the sub-field B, and the pattern PT1 is registered in the sub-field A combination of the patterns PT1*a*, PT1*b* and PT1*c*.

The beam dosage for a pattern portion where the dual exposure takes place is set lower than that for the other parts of the pattern. For example, the dosage of one shot of electron beam impinged on the portion where the dual exposure takes place is set to half that of the electron beam impinged on the other parts of the pattern. One approach to make this possible is to have the exposure data preparing unit set a registered beam dosage to half. Another approach is to have the electron beam exposure apparatus cut the beam dosage to half. In the latter approach, registration of the exposure data is such that the pattern data has a flag attached thereto indicating that the data is for segmented patterns that extend in adjacent fields. Upon receiving the pattern data having the flag attached thereto, the electron beam exposure apparatus sets the beam dosage in the pattern to, for example, half that of the currently set level.

The above-described process is conducted in each sub-field at a field boundary, both in the X direction and in the Y direction.

In the above-described scheme, the patterns at the field boundary are segmented and registered such that the boundary of the sub-field extension area is used as a boundary between the divided patterns. Alternatively, a hypothetical line that lies between the boundary of the sub-field and the boundary of the sub-field extension area may be used as a boundary between the divided patterns.

If a block exposure pattern is present in the sub-fields A and B, the division of the patterns as described above is not carried out. Instead, the sub-fields A and B are exposed twice. The block pattern which is present in the sub-field A and which resides in the sub-field B extension area is registered in the sub-field B. As a result of this, the block pattern that resides in the sub-field extension area B is exposed twice, that is, when the sub-field A is exposed and when the sub-field B is exposed. Details of the dual exposure have already been described.

Figure 16:
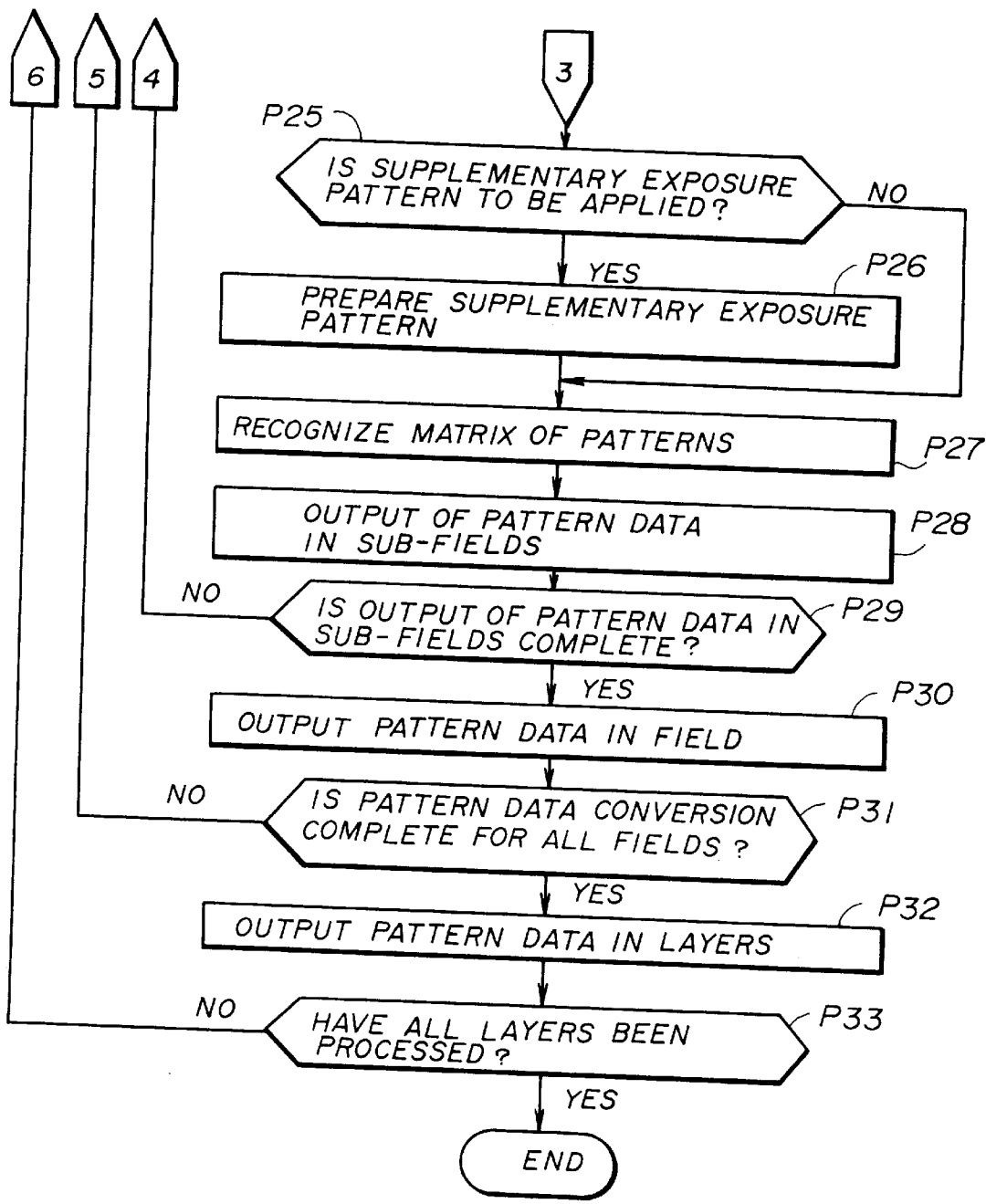
FIG. 16 is a flowchart (part 3) showing exposure data preparation according to the embodiments of the present invention.
Figure 35:
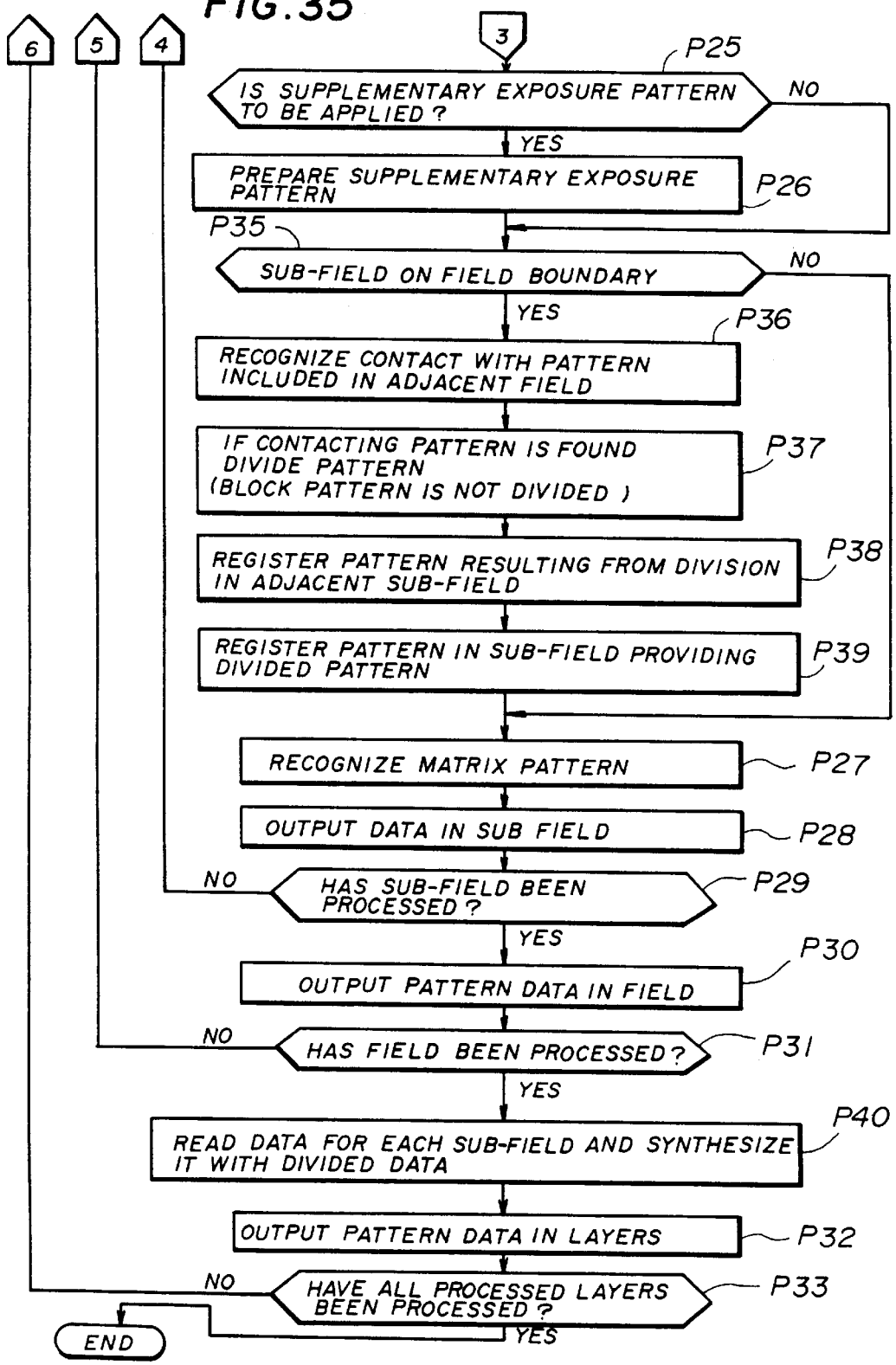
FIG. 35 is a flowchart showing a process according to the sixth embodiment of the present invention.

The above-described process is performed according to a flowchart shown in FIG. 35 which results by adding steps P35–40 to the flowchart of FIG. 16.

Subsequent to step P35, a determination is made in step P27 as to whether or not the sub-field now processed is a sub-field at the field boundary. If a negative answer is yielded in step P35, the control is turned over to step P27. If an affirmative answer is yielded in step S27, recognition of how the patterns in the adjacent fields are in contact with each other occurs in step P36 so that the patterns (contacting patterns) at the field boundary are determined. While FIGS. 33 and 34 illustrate the sub-fields A and B that are adjacent to each other across the field boundary that extends in the Y direction, the contacting patterns adjacent to each other across the field boundary that lies in the X direction are determined if the sub-fields A and B are adjacent to each other across the field boundary that extends in the X direction. The pattern data in the currently processed sub-fields that are adjacent to each other across the field boundary is read into the pattern data preparing apparatus by executing the process shown in the flowchart of FIGS. 14 and 15.

If the contacting patterns are found, the pattern division is conducted in step P37. The pattern division is carried out in step P37. The pattern division is already illustrated in FIGS. 33 and 34. If the pattern that is present in the sub-field is a block exposure pattern, the pattern division is not carried out.

Next, in step P38, the patterns obtained by the division are registered as the patterns in the adjacent sub-field. In the case of FIG. 33, the pattern PT1b obtained as a result of the division of the sub-field A is registered as the pattern in the sub-field B. In the case of the block exposure pattern, this pattern is registered in the adjacent sub-field. In order to indicate that this pattern is registered in step P38, a flag is inserted. This flag is used in the electron beam exposure apparatus as described earlier. Using the flag, the beam dosage in the pattern having the flag inserted therein is set to, for example, ½ of the beam exposure specified by the received data.

In step P39, the patterns obtained as a result of the division are registered in the sub-field whose pattern is divided. For example, in the case of FIGS. 33, the patterns PT1*a* and PT1*b*, instead of the pattern PT1 are registered in the sub-field A. In this process, a flat is inserted in the pattern PT1b which is registered in the sub-field B. In the case of the block pattern, a flag is inserted in the block pattern that is registered in the adjacent sub-field.

Thereafter, the processes indicated in steps P27–P31 are executed, as described earlier. In step P40, the pattern for each sub-field is read and the divided patterns are synthesized. Since the patterns registered in step P38 are registered as separate files due to system requirement, it is necessary to obtain the original pattern based on the pattern data in the files. As a result of this process, in the example of FIG. 33, all the patterns exposed in an exposure in the sub-field B are compiled in a single file.

The flag is processed in the electron beam control unit 101 shown in FIG. 31. For example, the electron beam control unit reduces the beam dosage specified in the received data to ½. The exposure process is carried out in accordance with the control signals S1–S4.

While the exposure data preparation for the electron beam exposure apparatus in the description of the embodiments given above, the exposure data preparing method of the present invention can also be applied to preparing exposure data for ion beam exposure apparatuses.

The present invention is not limited to the above described embodiments, and variations and modifications may be made without departing from the scope of the present invention.

What is claimed is:

1. An exposure data preparing apparatus for preparing exposure data for a charged beam exposure apparatus based on design data for an exposed object, said exposure data preparing apparatus comprising:

placement means for placing an exposure pattern corresponding to said design data for first fields obtained by dividing an exposed field on said expo ed object, each of said first fields being covered by deflection of a charged particle beam emitted by said charged beam exposure apparatus;

field preparing means for preparing second fields by dividing each of the first fields independently of the exposure pattern, so that the exposure pattern is divided into parts on the basis of the second fields; and calculating means for calculating a beam dosage of the charged particle beam with regard to the exposure patterns on the basis of area densities of the parts of the exposure patterns.

2. The exposure data preparing apparatus as claimed in claim 1, wherein said calculating means calculates a spatial ratio of the exposure pattern in said second fields, based on a size of said second fields and a size of the exposure pattern that occupies said second fields, and determines a correction ratio with respect to the beam dosage of the charged particle beam in accordance with said spatial ratio.

3. The exposure data preparing apparatus as claimed in claim 1, wherein said calculating means sets the correction ratio low when the density of the exposure pattern in said second fields is great, and sets the correction ratio high when the density of the exposure pattern is small.

4. The exposure data preparing apparatus as claimed in claim 1, further comprising calibrating means for integrating the density of the exposure pattern that occupies said second fields surrounding a target second field that is a target of correction with an arbitrary separation therefrom, integration being done along a path between said target second field and the surrounding second fields, so as to obtain a calibration ratio for calibrating the density of the exposure pattern that occupies the surrounding second fields.

5. The exposure data preparing means as claimed in claim 1, further comprising pattern preparing means for preparing a supplementary exposure pattern adjacent to a second field, in accordance with the density of the exposure pattern that occupies said second field.

6. The exposure data preparing apparatus as claimed in claim 1, wherein said calculating means forms a pattern that is adjacent to a predetermined field boundary and is found inside a predetermined range, with a plurality of exposure processes.

7. A charged particle beam exposure apparatus comprising:

data preparing means for preparing exposure data based on design data for an exposed object;

a control unit for supplying control signals for a beam deflector system in accordance with output data from said data preparing means;

deflecting means for deflecting the charged particle beam in accordance with output signals from said control unit; wherein said data preparing means is embodied by the exposure data preparing apparatus as claimed in claim 1.

8. The charged particle beam exposure apparatus as claimed in claim 7, wherein said deflecting means is provided with mask means for exposing a block pattern.

9. The charged particle beam exposure apparatus as claimed in claim 8, wherein said calculating means calculates the beam dosage of the charged particle beam so that the pattern inside the predetermined range is formed by a plurality of exposure processes.

10. An exposure data preparing method for preparing exposure data for a charged particle beam exposure apparatus based on design data for an exposed object, comprising:

preparing first fields covered by deflection of a charged particle beam deflected by said charged particle beam exposure apparatus, by dividing all exposed field on the exposed object;

placing an exposure pattern corresponding to the design data for each of the first fields on the exposed object;

preparing second fields by dividing each of the first fields independently of the exposure pattern, the exposure pattern being divided into parts on the basis of the second fields;

obtaining, for each of the second fields, a density of the exposure pattern that occupies said second fields; and determining a beam dosage of the charged particle beam, with regard to the exposure pattern, on the basis of area densities of the parts of the exposure pattern.

11. The exposure data preparing method as claimed in claim 10, wherein said determining comprises:

determining the beam dosage of the charged particle beam in accordance with the size of the exposure pattern;

determining a correction ratio with respect to the beam dosage of the charged particle beam based on the density of the exposure pattern that occupies the second fields; and adjusting the beam dosage of the charged particle beam in the exposure pattern, in accordance with the correction ratio.

12. The exposure data preparing method as claimed in claim 10, further comprising determining whether the design data includes a block pattern which can be covered by a single block exposure shot of the charged particle beam, wherein said preparing second fields comprises dividing each of the first fields into the second field when the block pattern is included in the design data, each of the second fields being commensurate with a size of the block pattern; and dividing each of the first fields into the second fields when the block pattern is not included in the design data, each of the second fields being covered by a single shot of charged particle beam.

13. The exposure data preparing method as claimed in claim 10, wherein a reference beam dosage is set in a target second field prepared in the first field, the reference beam dosage serving as a reference for the density of the exposure pattern that occupies the second fields surrounding the target second field; and a supplementary exposure pattern commensurate with a size of the second fields surrounding the target second field is applied to a neighborhood of the exposure pattern, application being in accordance with said reference beam dosage.

14. The exposure data preparing method as claimed in claim 10, further comprising correcting the density of the exposure pattern that occupies a target second field prepared in one of the first fields in accordance with the density of the exposure pattern that occupies the second fields that surround the target second field.

15. The exposure data preparing method as claimed in claim 10, wherein said obtaining comprises obtaining the density of the exposure pattern that occupies a target second field in one of the first fields, wherein the second field is a target for correction, by adding an average density of the exposure patterns in the second fields that surround the target second field with an arbitrary separation therefrom, to the density of the exposure pattern that occupies the target second field.

16. The exposure data preparing method as claimed in claim 10, wherein said obtaining comprises obtaining the density of the exposure pattern that occupies target second fields prepared in one of the first fields by adding an average of the density of the exposure patterns that occupy the second fields surrounding the target second fields with an arbitrary separation therefrom, to an average of the density of the exposure patterns that occupy the target second fields.

17. The exposure data preparing method as claimed in claim 10, wherein each of the second fields prepared in said preparing has a size obtained by dividing sides of the first field by an integer.

18. The exposure data preparing method as claimed in claim 10, wherein the exposed field of the exposed object which is divided in said preparing, is divided into a temporary singular placement field that does not include any exposure pattern, a matrix placement field in which the exposure pattern is repeated, and a singular placement field in which the exposure pattern is not repeated.

19. The exposure data preparing method as claimed in claim 10, further comprising determining whether the design data includes a matrix placement field and, when the matrix placement field is detected, dividing the matrix placement field so as to produce second matrix placement sub-fields, each of the second matrix placement sub-fields being covered by a single shot of the charged particle beam;

preparing a reference matrix placement pattern by calculating the beam dosage of the charged particle beam in accordance with the density of the exposure pattern that occupies the second matrix placement sub-fields in the matrix placement field; and determining the beam dosage of the charged particle beam in the matrix placement field area other than the second matrix placement sub-fields in accordance with the reference matrix placement pattern.

20. The exposure data preparing method as claimed in claim 10, further comprising forming an exposure pattern that is adjacent to a predetermined field boundary and is found inside a predetermined range, using a plurality of exposure processes.

21. An exposure data preparing apparatus for a charged beam exposure apparatus, comprising:

a field placement editor which divides an exposed field on an object to be exposed into first fields and which produces an exposure pattern corresponding to design data for the first fields;

a map preparing editor to prepare second fields having an exposure pattern by dividing each of the first fields independently of the exposure pattern, so that the exposure pattern is divided into parts on the basis of the second fields; and a processor to calculate a beam dosage of the charged particle beam with regard to the exposure pattern on the basis of area densities of the parts of the exposure patterns.

22. A method for preparing exposure data for a charged particle beam exposure apparatus based on design data, comprising:

preparing first fields by dividing an exposed field on an object based on an exposure pattern corresponding to the design data;

dividing each of the first fields into second fields independently of the exposure pattern, so that the exposure pattern is divided into parts on the basis of the second fields;

obtaining a density of the exposure pattern for each of the second fields; and determining a beam dosage with regard to the exposure pattern, based on the area densities of the parts of the exposure pattern.

* * * * *

UNITED STATES PATENT AND TRADEMARK OFFICE
CERTIFICATE OF CORRECTION

PATENT NO.: 5,955,738
DATED : September 21, 1999
INVENTOR(S): Yasuo MANABE et al.

It is certified that error appears in the above-identified patent and that said Letters Patent is hereby corrected as shown below:

Col. 27, line 15, begin a new paragraph with "said".

Signed and Sealed this

Seventh Day of March, 2000

Attest:

Attesting Officer

Q. TODD DICKINSON

Commissioner of Patents and Trademarks